United States Patent
Peng et al.

(10) Patent No.: US 9,385,124 B1
(45) Date of Patent: Jul. 5, 2016

(54) METHODS OF FORMING REDUCED THICKNESS SPACERS IN CMOS BASED INTEGRATED CIRCUIT PRODUCTS

(71) Applicant: GLOBALFOUNDRIES Inc., Grand Cayman (KY)

(72) Inventors: Wen Pin Peng, Clifton Park, NY (US); Min-hwa Chi, Malta, NY (US); Garo Jacques Derderian, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/845,499

(22) Filed: Sep. 4, 2015

(51) Int. Cl.
| | |
|---|---|
| *H01L 21/336* | (2006.01) |
| *H01L 27/092* | (2006.01) |
| *H01L 21/8238* | (2006.01) |
| *H01L 21/311* | (2006.01) |
| *H01L 29/66* | (2006.01) |
| *H01L 21/02* | (2006.01) |
| *H01L 29/78* | (2006.01) |
| *H01L 29/165* | (2006.01) |

(52) U.S. Cl.
CPC .......... *H01L 27/092* (2013.01); *H01L 21/0214* (2013.01); *H01L 21/0217* (2013.01); *H01L 21/31111* (2013.01); *H01L 21/31144* (2013.01); *H01L 21/823814* (2013.01); *H01L 21/823828* (2013.01); *H01L 21/823864* (2013.01); *H01L 29/165* (2013.01); *H01L 29/6653* (2013.01); *H01L 29/66636* (2013.01); *H01L 29/7848* (2013.01)

(58) Field of Classification Search
CPC ................ H01L 27/092; H01L 29/165; H01L 21/823864; H01L 29/66636; H01L 21/823468; H01L 29/6653; H01L 29/6656; H01L 29/66689

USPC ........... 257/288, 368, 369; 438/151, 197, 199
See application file for complete search history.

(56) References Cited

U.S. PATENT DOCUMENTS

| | | | |
|---|---|---|---|
| 8,222,100 B2 | 7/2012 | Cheng et al. | |
| 2006/0099745 A1* | 5/2006 | Hsu ................. | H01L 21/823807 438/149 |
| 2009/0246926 A1* | 10/2009 | Gehring ............ | H01L 21/26513 438/305 |

(Continued)

OTHER PUBLICATIONS

Arkles, "Hydrophobicity, Hydrophilicity and Silanes," Paint & Coatings Industry, Oct. 2006.

(Continued)

*Primary Examiner* — Jarrett Stark
*Assistant Examiner* — Shahed Ahmed
(74) *Attorney, Agent, or Firm* — Amerson Law Firm, PLLC

(57) ABSTRACT

One method disclosed herein includes, among other things, forming a first spacer proximate gate structures of first and second transistors that are opposite type transistors, forming an initial second spacer proximate the first spacer of the first transistor and a layer of second spacer material above the second transistor, performing a timed, wet etching process on both of the transistors so as to completely remove the layer of second spacer material from the second transistor while leaving a reduced thickness second spacer positioned adjacent the first spacer of the first transistor, wherein the reduced thickness second spacer has a thickness that is less than an initial thickness of the initial second spacer, and forming a third spacer on and in contact with the first spacer of the second transistor.

29 Claims, 19 Drawing Sheets

(56) References Cited

U.S. PATENT DOCUMENTS

| | | | | |
|---|---|---|---|---|
| 2009/0321850 A1* | 12/2009 | Griebenow | ....... | H01L 21/26513 257/392 |
| 2011/0062519 A1* | 3/2011 | Pal | ................ | H01L 21/823807 257/347 |
| 2011/0248328 A1* | 10/2011 | Shen | ................ | H01L 21/28273 257/316 |
| 2013/0015527 A1* | 1/2013 | Thees | ............. | H01L 21/823814 257/369 |

OTHER PUBLICATIONS

Huang et al., "Low-k Spacers for Advanced Low Power CMOS Devices with Reduced Parasitic Capacitances," 2008 IEEE International SOI Conference Proceedings, pp. 19-20, 2008.

Ko et al., "A Novel CVD-SiBCN Low-K Spacer Technology for High-Speed Applications," 2008 Symposium on VLSI Technology Digest of Technical Papers, pp. 108-109, 2008.

* cited by examiner

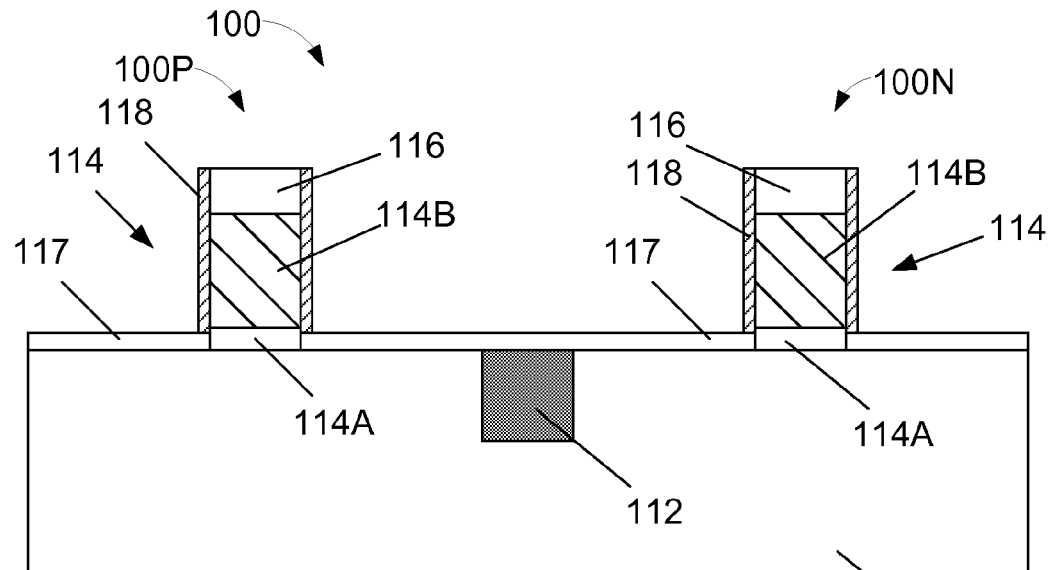
(Prior Art) Figure 3A
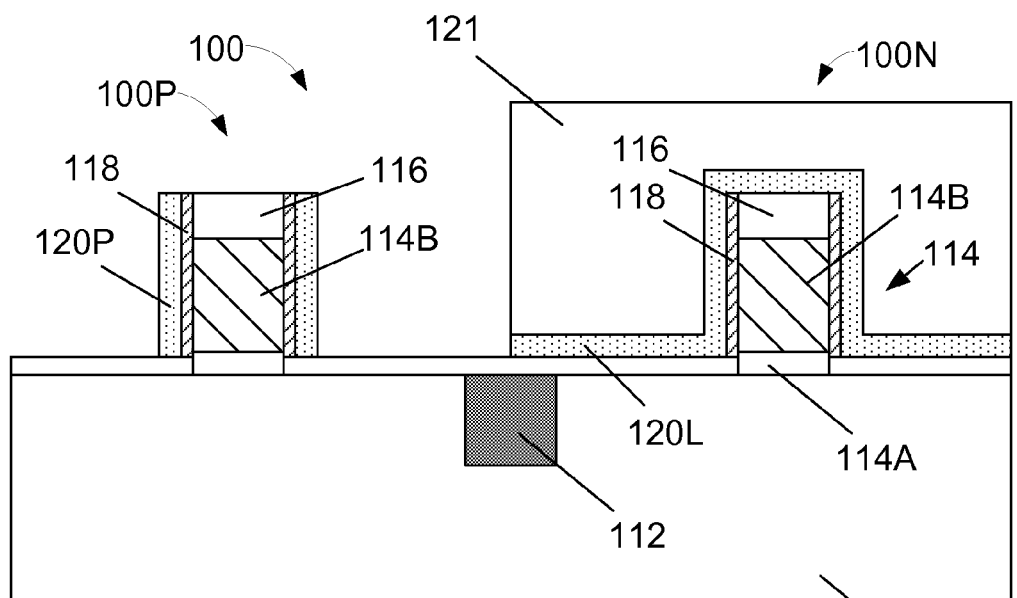
(Prior Art) Figure 3B

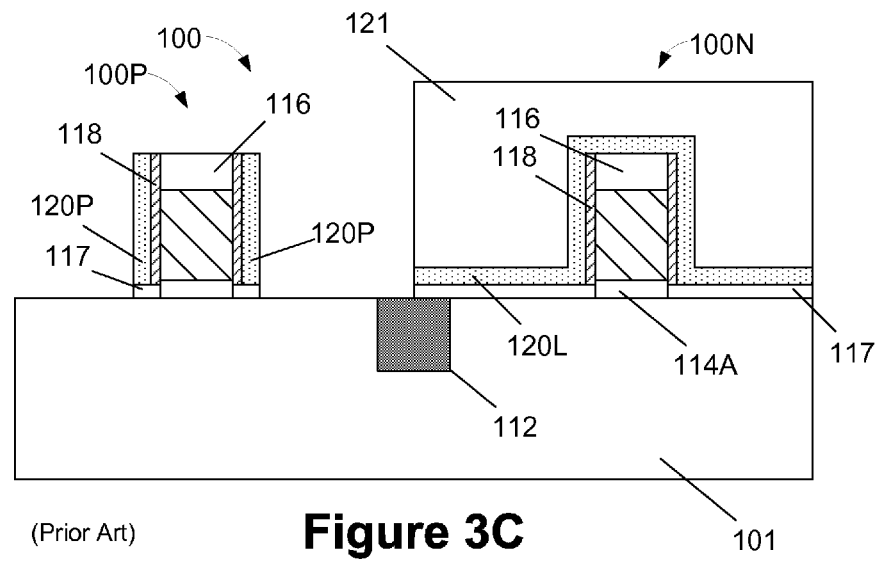
(Prior Art) Figure 3C
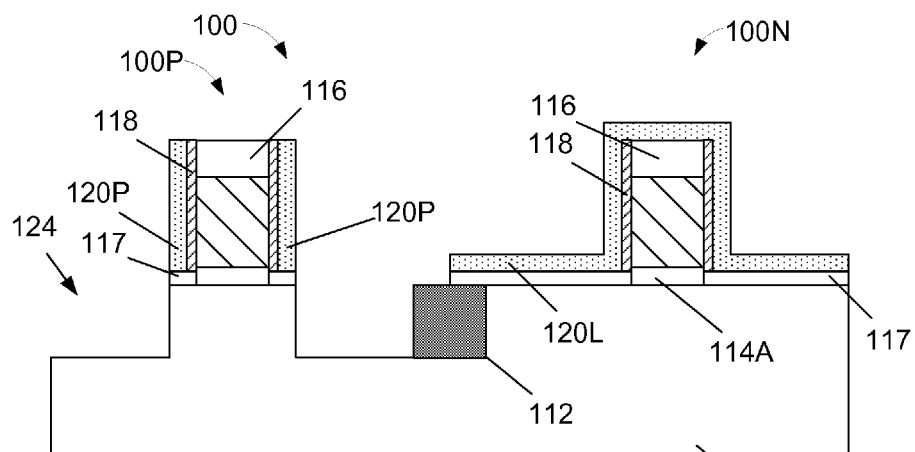
(Prior Art) Figure 3D

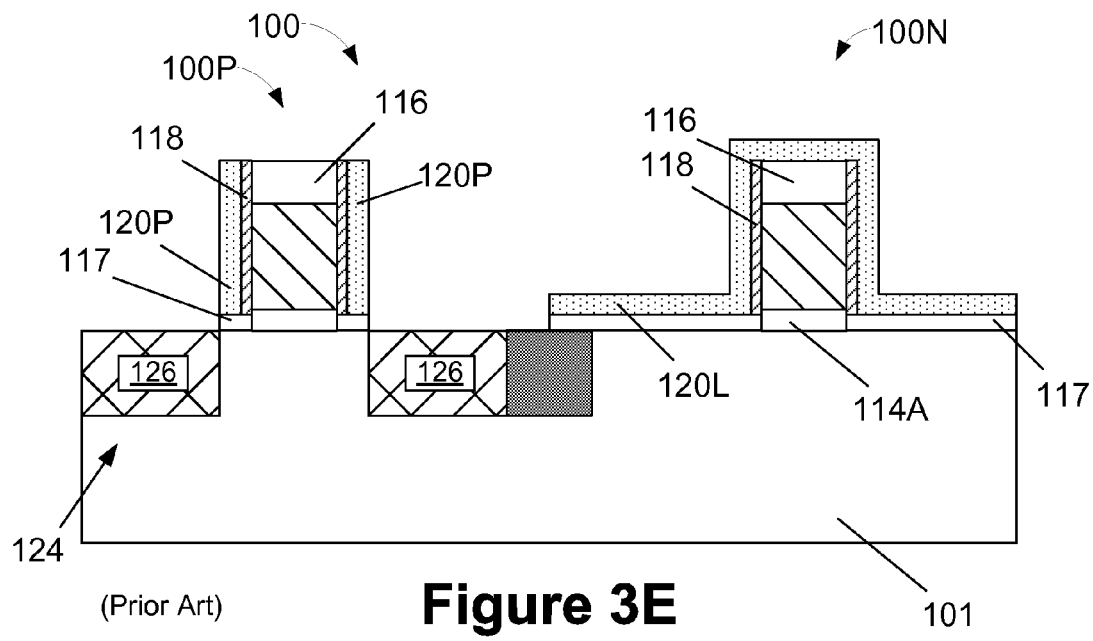
(Prior Art) Figure 3E
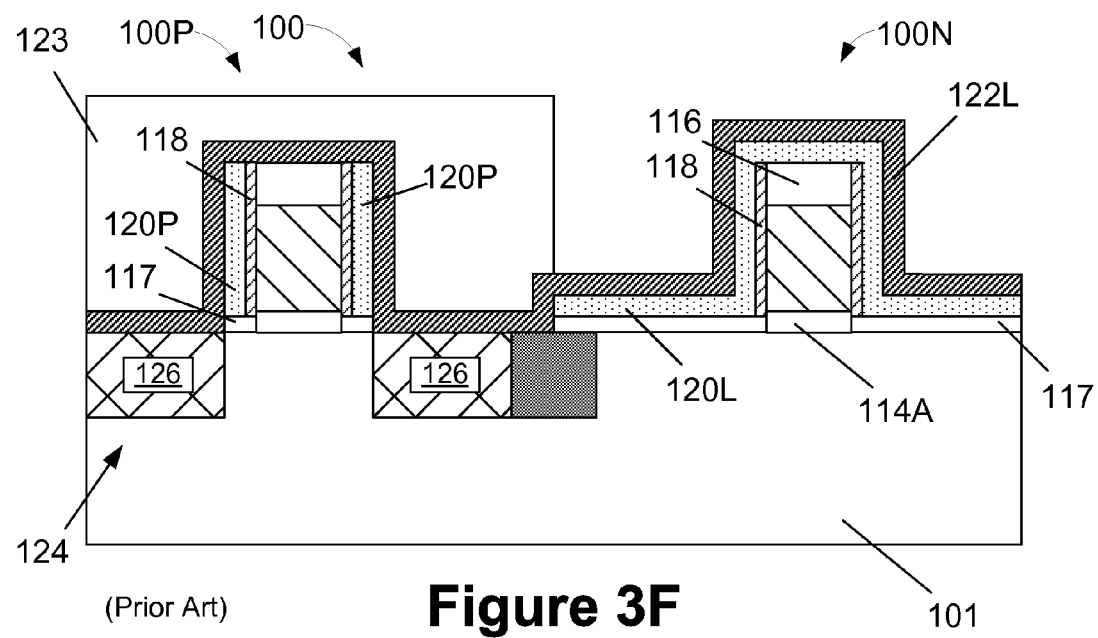
(Prior Art) Figure 3F

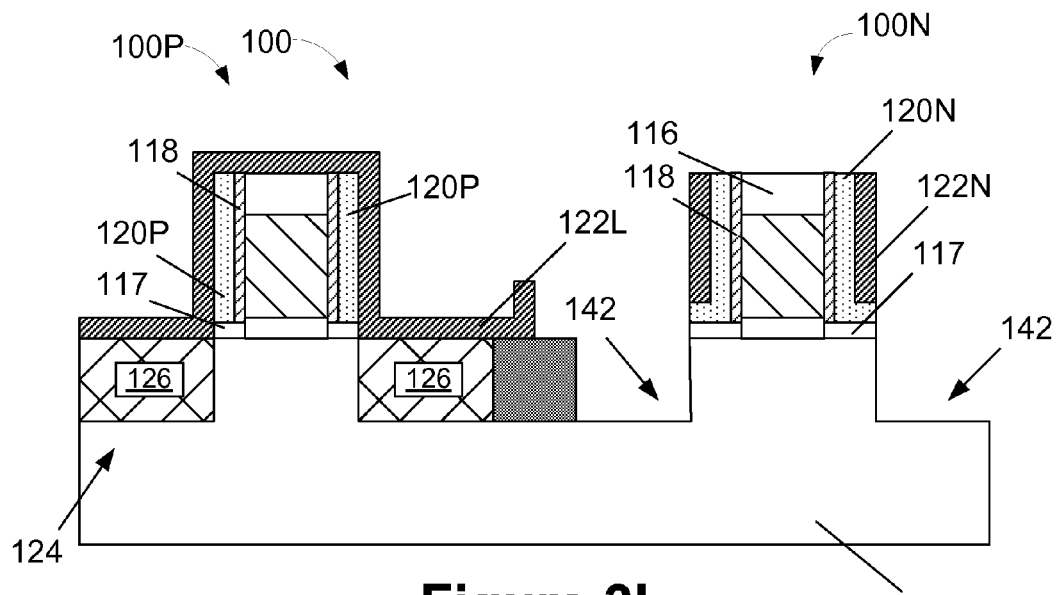
(Prior Art) Figure 3I
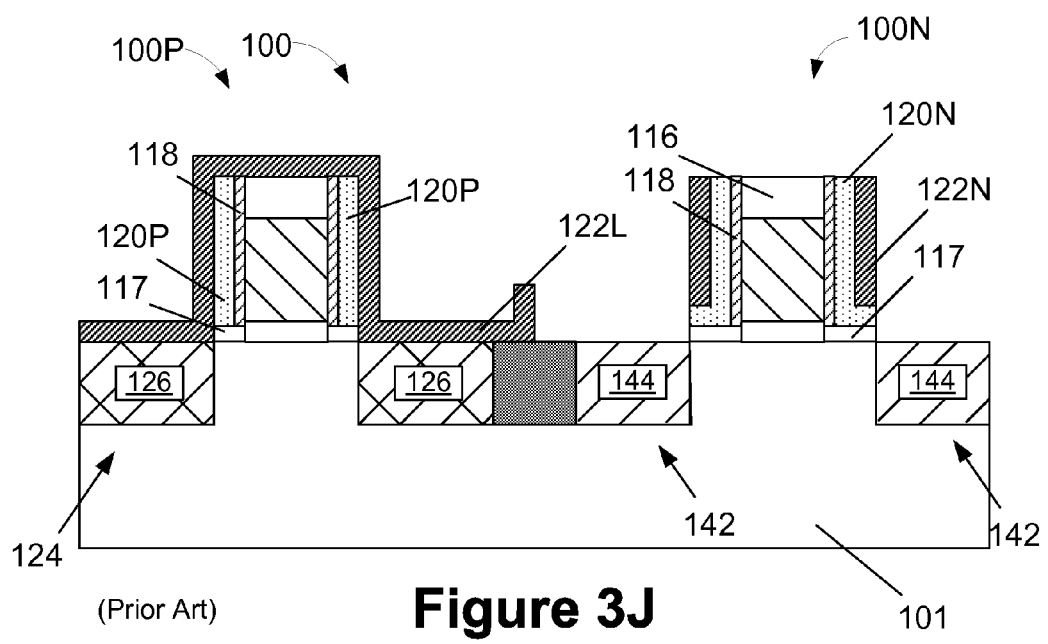
(Prior Art) Figure 3J

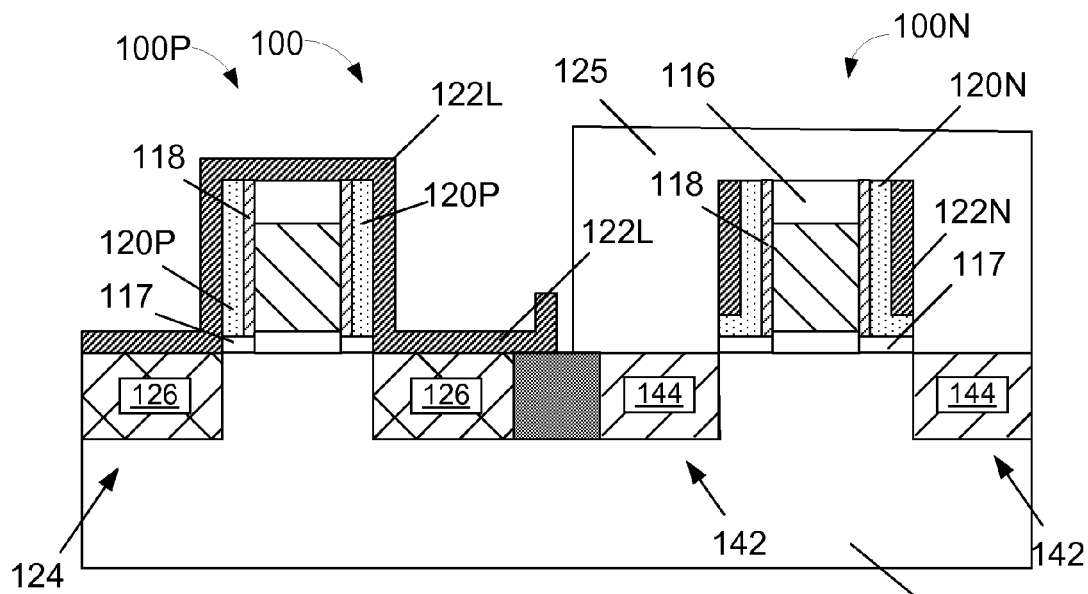
(Prior Art) Figure 3K
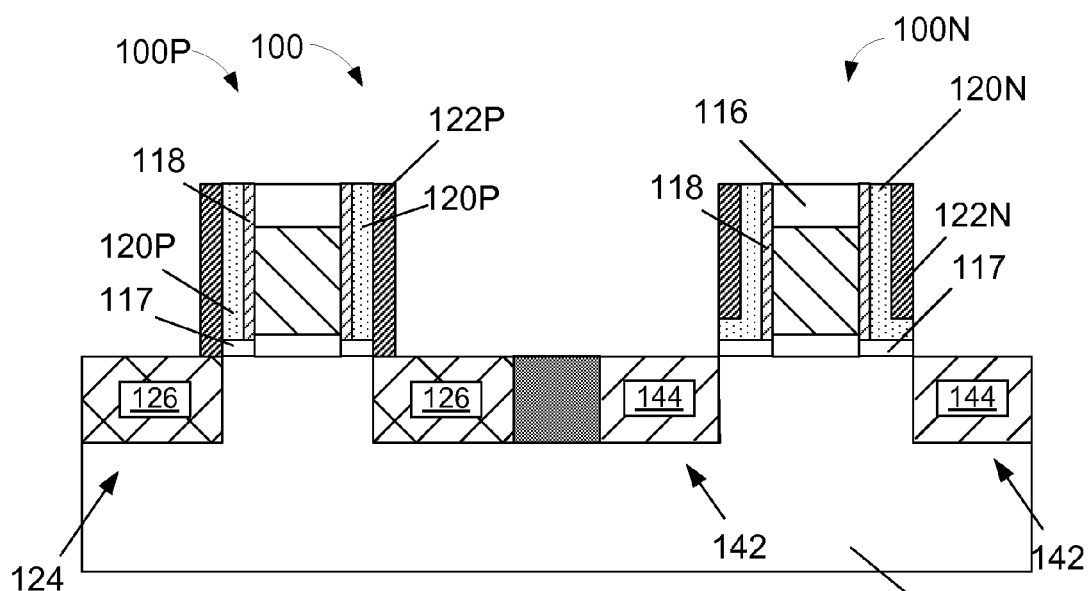
(Prior Art) Figure 3L

METHODS OF FORMING REDUCED THICKNESS SPACERS IN CMOS BASED INTEGRATED CIRCUIT PRODUCTS

BACKGROUND OF THE INVENTION

1. Field of the Invention

Generally, the present disclosure relates to the manufacturing of sophisticated semiconductor devices, and, more specifically, to various novel methods of forming reduced thickness sidewall spacers in CMOS based integrated circuit products.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. A so-called metal oxide field effect transistor (MOSFETs or FETs) is one commonly employed circuit element that is found on integrated circuit products. The transistors are typically either NMOS (NFET) or PMOS (PFET) type devices wherein the "N" and "P" designation is based upon the type of carriers (n- or p-type) in channel with consistent dopants used to create the source/drain regions of the devices. So-called CMOS (Complementary Metal Oxide Semiconductor) technology or products refers to integrated circuit products that are manufactured using both NMOS and PMOS transistor devices.

Irrespective of the physical configuration of the transistor device, each device comprises spaced-apart drain and source regions formed in a semiconductor substrate and a gate structure positioned above the substrate and between the source/drain regions. The gate structure is typically comprised of a relatively thin gate insulation layer (e.g., silicon dioxide or a high-k insulating material) positioned on the substrate between the source/drain regions and one or more conductive materials (e.g., polysilicon, one or more metal layers, etc.) that serve as the gate electrode for the device. A gate cap layer (e.g., silicon nitride) is formed above the gate structure and a sidewall spacer (e.g., silicon nitride) is formed adjacent the sidewalls of the gate structure. The gate cap layer and the sidewall spacer are provided to electrically isolate the gate structure and protect the gate structure during subsequent processing operations that are preformed to complete the device. Upon application of an appropriate control voltage to the gate electrode, a conductive channel region forms between the drain region and the source region. The gate structures for such transistor devices may be manufactured using so-called "gate-first" (i.e., wherein the gate structure is formed before the source/drain regions are formed) or "replacement gate" (gate-last) (i.e., wherein the final gate structure is formed after the source/drain regions are formed) manufacturing techniques.

FIG. 1 depicts an illustrative prior art semiconductor product 10 comprised of first and second transistors 11A, 11B formed in and above the substrate 12. Each of the transistors 11A, 11B is comprised of a schematically depicted gate structure 13 (which includes the gate insulation layer and gate electrode that are not separately depicted), a gate cap layer 14 and a sidewall spacer 15. Also depicted are illustrative raised source/drain regions 18 and a plurality of self-aligned contacts 20 that are positioned in a layer of insulating material 19, e.g., silicon dioxide. The self-aligned contacts 20 are conductively coupled to the raised source/drain regions 18. The spacers 15 are typically made of silicon nitride which has a relatively high k value of, e.g., about 7-8. As a result of the structure of the transistors, a gate-to-contact capacitor is generally defined in the dashed-line regions 21, where the gate electrode of the gate structure 13 functions as one of the conductive plates of the capacitor and the self-aligned contact 20 functions as the other conductive plate of the capacitor. In other cases, the contact 20 may be formed by performing traditional lithography/etching processes, i.e., portions of such traditionally formed contact 20 (not shown in FIG. 1) may not be positioned above a portion of the spacer 15. The presence of the silicon nitride spacer material (with a relatively high k value) tends to increase the parasitic capacitance between the conductive gate electrode and self-aligned contacts. This problem has become even more problematic as packing densities have increased, which causes the gate structures of adjacent transistors to be positioned ever closer to one another (thus, the "self-aligned" contact structure 20 with contact metal in direct contact with the spacer 15, as illustrated in FIG. 1, is one technique used in advanced CMOS products). Unfortunately, the gate-to-contact capacitor tends to slow down the switching speed of the transistor as this capacitor must be charged and discharged each time the transistor is turned on-off.

The use of alternative materials for the sidewall spacers, such as materials having k values less than about 7.0 (i.e., lower than the k value of silicon nitride), has been desirable but often problematic. Most of such low-k materials are based upon carbon or boron doped silicon nitride (other examples include spacers comprised of organosilicate glass (OSG), fluorine doped $SiO_2$, carbon doped $SiO_2$, porous $SiO_2$, porous carbon doped $SiO_2$, spin-on organic polymeric dielectrics, hydrogen silsesquioxane (HSQ), methylsilsesquioxane (MSQ) or combinations of such materials) and they are often porous in nature and may have pin-holes. The low-k material, when used as a traditional spacer material, is subjected to subsequent process steps, e.g., wet cleans, ion implantation, a reactive ion etching (RIE) process, etc., in order to define the position where the source/drain regions will be located. These post-spacer formation processing steps tend to deplete the carbon and boron, thereby effectively increasing the k value of the low-k material. Such low-k materials also tend to be weaker mechanically than silicon nitride, which makes them less capable of standing up to the subsequent processing steps (to serve as barriers to contaminants and moisture) after they are formed, e.g., wet cleaning processes, etching processes, etc. For example, such low-k spacers are difficult to integrate into process flows involving the formation of epi materials in the source/drain regions of the devices (e.g., epi SiGe for PMOS devices and epi-SiC for NMOS devices) due to the cleaning processes and the RIE cavity etching processes performed prior to the epi growth process and the unwanted growth of the epi materials on the low-k spacers. Moreover, such spacers are typically subjected to ion implantation with relatively high temperature source/drain anneal processes, which also tends to damage and deplete the carbon and boron from such low-k materials.

FIGS. 2A-2C depict one illustrative prior art technique that device designers have employed in an attempt to incorporate low-k spacers into integrated circuit products. FIG. 2A depicts a transistor device 50 at an advanced stage of fabrication that has been formed in and above a semiconductor substrate 51. As shown therein, the transistor 50 is comprised of a simplistically depicted gate structure 53 (which includes a gate insulation layer 53A and gate electrode 53B), a silicon dioxide liner layer 52, a gate cap layer 55 and a silicon nitride sidewall spacer 54. The silicon nitride spacer 54 is conventionally used as a diffusion barrier for protecting the materials of the gate structure 53 from contaminants and moisture. The silicon dioxide liner layer 52 serves as a buffer layer between the silicon nitride spacer 54 and materials of the gate structure 53. Also depicted are illustrative source/drain regions 56 and metal silicide regions 58. At the point of processing depicted in FIG. 2A, the transistor 50 is basically complete. However, with reference to FIG. 2B, to incorporate a low-k spacer into the finished device (for achieving a lower capacitance between the gate structure 53 and the source/drain contact structures (not shown in FIGS. 2A-2C)), an etching process was performed to selectively remove the silicon nitride sidewall spacer 54 relative to the surrounding materials. Then, as shown in FIG. 2C, a low-k sidewall spacer 60 was formed on the device 50 to essentially replace the silicon nitride sidewall spacer 54. The low-k spacer 60 was formed by depositing a layer of low-k material and thereafter performing an anisotropic etching process as is well known to those skilled in the art. The spacer 60 may be formed selectively in the N and P regions of the product using known lithography and etching techniques. In some cases, the low-k spacer 60 may be made of a silicon nitride material with added carbon and/or oxygen (e.g., SiOCN). Low-k spacers of such materials tend to function well as barriers to contaminants and moisture, tend to be pin-hole free, and also have a lower k value than that of traditional silicon nitride spacers (e.g., about 7.8).

FIGS. 3A-3L depict one illustrative prior art technique for forming CMOS based products that involves the formation of a number of spacers and the formation of epi semiconductor material in the source/drain regions of the devices. In the remaining drawings in this application, the various spacers that are formed will be depicted as simply rectangular shaped structures so as not to overly complicate the drawings. In a real world device, the sidewall spacers will have more of a curved outer surface like that of the spacers 54 and 60 depicted in FIGS. 2A-2C wherein the spacers tend to be thicker at the base of the spacer and thinner as one progresses up the height of the spacers. The spacers may also have an irregular outer surface like that of the spacers 15 depicted in FIG. 1 (after performing self-aligned contact litho/etching processes). Moreover, to the extent reference is made to a thickness of a spacer in this application, it will refer to the thickness of the spacer at the base of the spacer. Additionally, the formation of transistors typically involves performing one or more ion implantation processes at various points in the process flow to form various doped regions in the substrate, such as halo implant regions, extension implant regions (or LDD implant regions) and deep source/drain implant regions. In many of the cases, one or more spacers are formed adjacent the gate structure so as to control the location of the various implant regions and/or to control the location where cavities may be formed in the source/drain regions of the NFET and PFET devices, wherein different stressed epi semiconductor materials will be formed in the cavities of the NFET and PFET devices. However, so as not to overly complicate the attached drawings, the various doped regions that are found in transistor devices are not depicted in the drawings.

FIGS. 3A-3L depict one illustrative prior art process flow for forming a CMOS integrated circuit product 100 that includes an illustrative PMOS transistor 100P and an illustrative NMOS transistor 100N using an illustrative combination of spacers. As shown in FIG. 3A, the process begins with the formation of illustrative gate structures 114 for the PMOS transistor 100P and the NMOS transistor 100N in and above regions of the substrate 101 that are separated by an illustrative shallow trench isolation structure 112 (not to scale—just for illustrative purposes). The gate structures 114 generally include a gate insulation or gate dielectric layer 114A and one or more conductive gate electrode layers 114B. A gate cap (or hard mask) layer 116, made of a material such as silicon nitride, is formed above the gate structures 114. Also depicted in FIG. 3A is an illustrative layer 117, made of a material such as silicon dioxide, e.g., a pad oxide layer. The gate structures 114 depicted herein are intended to be schematic and representative in nature, as the materials of construction used in the gate structures 114 may be different for the PMOS transistor 100P as compared to the NMOS transistor 100N (for individually tuning the work-function for the NMOS and PMOS devices), e.g., the thickness of the multiple layers of conductive metal in the gate 114B may be different for the PMOS transistor 100P and the NMOS transistor 100N, etc. The gate insulation layer 114A may be comprised of a variety of materials, such as silicon dioxide, silicon oxynitride, a high-k (k value greater than 10) insulating (dielectric) material. The gate electrode layer 114B may be comprised of one or more layers of conductive materials, such as polysilicon, a metal-nitride (e.g., TiN, TaN), a metal (e.g., Al or W), etc. The gate structure depicted in FIG. 3A may be formed by performing a variety of known techniques. For example, using a so-called "gate first" manufacturing technique, the layers of material that make up the gate insulation layer 114A, the gate electrode layer 114B and the gate cap layer 116 may be blanket-deposited above the substrate 101 and, thereafter, one or more etching processes are performed through a patterned mask layer (not shown) to define the basic gate structures depicted in FIG. 3A. Of course, the gate structures 114 could also be sacrificial gate structures in the case where a replacement gate process is used to manufacture the product 100, wherein a replacement gate structure is formed after the source/drain regions of the device are completed. FIG. 3A also depicts the product 100 after a sidewall spacer 118 ("spacer 1"), typically made of traditional silicon nitride or low-k spacer SiOCN, was formed adjacent the gate structures 114 of both the PMOS transistor 100P and the NMOS transistor 100N. Typically, a thin interfacial silicon dioxide layer (not shown) may be formed on the gate structures 114 prior to the formation of the spacer 118. The spacer 118 may have an illustrative base width of about 10-12 nm in advanced 20 nm CMOS technology products. The spacer 118 may be formed by depositing a layer of spacer material and thereafter performing an anisotropic etching back process. After the spacer 118 is formed, various ion implant processes may be performed on the devices 100N, 100P, respectively, through patterned implant masks.

FIG. 3B depicts the product 100 after several process operations were performed to form a PMOS sidewall spacer 120P ("spacer 2") adjacent the spacer 118 of the PMOS transistor 100P. First, a layer of spacer 2 material 120L was deposited above both the PMOS transistor 100P and the NMOS transistor 100N. Thereafter, an etch mask layer 121, such as photoresist, was formed so as to cover the NMOS transistor 100N while exposing the PMOS transistor 100P. Next, an anisotropic etching process was performed on the exposed portion of the layer of spacer 2 material 120L so as to define the PMOS sidewall spacer 120P (spacer 2 for the PMOS device). The PMOS sidewall spacer 120P may have an illustrative base width of about 10-20 nm. The layer of spacer 2 material 120L may be made of a material such as silicon nitride and it may be formed to any desired thickness.

FIG. 3C depicts the product 100 after an anisotropic etching process was performed through the etch mask layer 121 to remove exposed portions of the layer 117 on the PMOS transistor 100P.

FIG. 3D depicts the product 100 after several process operations were performed on the product 100. First, the etch mask layer 121 was removed by performing an ashing process. Thereafter, one or more etching processes (Si) were performed to define PMOS source/drain cavities 124 in areas of the substrate 101 where source/drain regions for the PMOS transistor 100P will ultimately be formed by forming a compressively stressed epi semiconductor material in the PMOS source/drain cavities 124. The depth and shape of the PMOS source/drain cavities 124 may vary depending upon the particular application. In one example, the PMOS source/drain cavities 124 may have an overall depth of about 50-70 nm.

FIG. 3E depicts the product 100 after an epitaxial growth process was performed to form compressively stressed epitaxial semiconductor material regions 126 (e.g., silicon germanium regions) in the PMOS source/drain cavities 124 for the PMOS transistor 100P. In the depicted example, the regions 126 have an upper surface that is substantially level with the upper surface of the substrate 101. In other cases, the epi semiconductor material 126 may be formed in such a manner so that it overfills the cavities 124 and its upper surface is positioned at a level that is above the upper surface of the substrate 101 (e.g., raised source/drain regions—not illustrated in FIG. 3E for simplicity) by about 10-20 nm. The epi regions 126 may be formed by performing well known epitaxial growth processes and they may be made of a material such as SiGe (with Ge content ~20-50%) so as to induce a compressive stress in the channel region of the PMOS transistor 100P and thereby enhance its current carrying capabilities. Note that the layer of spacer 2 material 120L remains positioned on the NMOS transistor 100N during the cavity etching process and the epi growth process.

FIG. 3F depicts the product 100 after several process operations were performed. First, a layer of spacer 3 material 122L was deposited above both the PMOS transistor 100P and the NMOS transistor 100N. Thereafter, an etch mask layer 123, such as photoresist, was formed so as to cover the PMOS transistor 100P while exposing the NMOS transistor 100N. The layer of spacer 3 material 122L may be made of a material such as silicon nitride and it may be formed to any desired thickness.

FIG. 3G depicts the product 100 after one or more etching processes were performed through the etch mask 123 on the spacer 3 and spacer 2 material layers 122L, 120L, respectively, to form a spacer structure comprised of an NMOS sidewall spacer 120N ("spacer 2") and an NMOS sidewall spacer 122N ("spacer 3") adjacent the spacer 118 (spacer 1) of the NMOS transistor 100N. The NMOS sidewall spacer 122N may have an illustrative base width of about 10-20 nm.

FIG. 3H depicts the product 100 after an anisotropic etching process was performed through the etch mask layer 125 to remove exposed portions of the layer 117 on the NMOS transistor 100N.

FIG. 3I depicts the product 100 after several process operations were performed on the product 100. First, the etch mask layer 125 was removed by performing an ashing process. Thereafter, one or more etching processes were performed to define NMOS source/drain cavities 142 in areas of the substrate 101 where source/drain regions for the NMOS transistor 100N will ultimately be formed by forming a tensile stressed epi semiconductor material in the NMOS source/drain cavities 142. The depth and shape of the NMOS source/drain cavities 142 may vary depending upon the particular application. In one example, the NMOS source/drain cavities 142 may have an overall depth of about 50-70 nm.

FIG. 3J depicts the product 100 after an epitaxial growth process was performed to form tensile stressed epitaxial semiconductor material regions 144 (e.g., silicon carbon regions) in the NMOS source/drain cavities 142 for the NMOS transistor 100N. In the depicted example, the regions 144 have an upper surface that is substantially level with the upper surface of the substrate 101. In other cases, the epi semiconductor material 144 may be formed in such a manner so that it overfills the NMOS source/drain cavities 142 and its upper surface is positioned at a level that is above the upper surface of the substrate 101 (e.g., raised source/drain regions) by about 10-20 nm. The epi regions 144 may be formed by performing well known epitaxial growth processes of, for example, a material such as SiC (with C content ~1-2%) so as to induce a tensile stress in the channel region of the NMOS transistor 100N and thereby enhance its current carrying capabilities. Note that the layer of spacer 3 material 122L remains positioned on the PMOS transistor 100P during the cavity etching process and the epi growth process.

FIG. 3K depicts the product 100 after an etch mask layer 125, such as photoresist, was formed so as to cover the NMOS transistor 100N while exposing the PMOS transistor 100P.

FIG. 3L depicts the product 100 after several process operations were performed on the product 100. First, an anisotropic etching process was performed on the exposed portion of the layer of spacer 3 material 122L so as to define a PMOS sidewall spacer 122P (spacer 3 for the PMOS device). The PMOS sidewall spacer 122P may have an illustrative base width of about 10-20 nm. Next, an ashing process was performed to remove the masking layer 125.

In the above-described process flow, each of the devices 100P, 100N are comprised of three spacers 118, 120 and 122. Unfortunately, the final combined thickness of the three spacers 118, 120 and 122 (considered collectively) is still relatively large and they were exposed to several post-formation processing steps (e.g., RIE, implants, wet clean, etc.) and were accordingly damaged. Portions of the spacer 120 are positioned above the epi regions 126 in the PMOS device 100P thereby making it more difficult (a smaller process window) to accurately land a contact structure to the source/drain regions of the PMOS device. Additionally, the presence of the spacer 120 (e.g., SiCON) can be problematic in that the spacer 120 interacts with the formation of the epi material regions 126 and 144, and the spacer 120 may exhibit more defects (e.g., pin holes) and suffer from inconsistent thickness variations when it is subjected to epi pre-clean processes and the presence of the spacer 120 can cause undesirable non-uniform loading of one or more of the epi growth processes.

What is needed is a new process flow for forming CMOS devices that, in some cases, can incorporate low-k spacers into the process flow in an efficient a manner. The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming reduced thickness sidewall spacers in CMOS based integrated circuit products. In one illustrative embodiment, a method disclosed herein includes, among other things, forming first and second transistors that are opposite type transistors, forming a first gate structure for the first transistor and a second gate structure for the second transistor, forming a first spacer proximate both the first and second gate structures, and forming an initial second spacer proximate the first spacer of the first transistor and a layer of second spacer material above the second transistor, the initial second spacer having an initial thickness. In this example, the method also includes performing a first timed, wet etching process on both the first transistor and the second transistor so as to completely remove the layer of second spacer material from the second transistor and thereby expose the first spacer of the second transistor while leaving a first reduced thickness second spacer positioned adjacent the first spacer of the first transistor, wherein the first reduced thickness second spacer has a thickness that is less than the initial thickness of the initial second spacer, and forming a third spacer for the second transistor on and in contact with the first spacer of the second transistor.

In another illustrative embodiment, a method disclosed herein of forming a CMOS integrated circuit product includes, among other things, forming first and second transistors that are opposite type transistors, forming a first spacer proximate both the first and second gate structures, forming an initial second spacer proximate the first spacer of the first transistor and a layer of second spacer material above the second transistor, the initial second spacer having an initial thickness, and performing a first timed, wet etching process on both the first transistor and the second transistor so as to completely remove the layer of second spacer material from the second transistor and thereby expose the first spacer of the second transistor while leaving a first reduced thickness second spacer positioned adjacent the first spacer of the first transistor, wherein the first reduced thickness second spacer has a thickness that is less than the initial thickness of the initial second spacer. In this example, the method also includes forming an initial third spacer proximate the first spacer of the second transistor and a layer of third spacer material above the first transistor, the initial third spacer having an initial thickness, and performing a second timed, wet etching process on both the first transistor and the second transistor so as to completely remove the layer of third spacer material from the first transistor and thereby expose the first reduced thickness second spacer of the first transistor while leaving a second reduced thickness third spacer positioned adjacent the first spacer of the second transistor, wherein the reduced thickness third spacer has a thickness that is less than the initial thickness of the initial third spacer.

One illustrative CMOS integrated circuit product disclosed herein includes, among other things, a first transistor of a first type and a second transistor of a second type, wherein the second type is opposite to the first type, a first gate structure of the first transistor and a plurality of first spacers positioned on the first transistor, wherein the plurality of first spacers comprises a first spacer positioned proximate the gate structure and a second spacer positioned on and in contact with the first spacer. In this example, the CMOS product also includes a second gate structure of the second transistor and a plurality of second spacers positioned on the second transistor, wherein the plurality of second spacers comprises a first spacer positioned proximate the second gate structure, wherein the first spacer on the second transistor is made of the same material as the first spacer on the first transistor, and a second spacer positioned on and in contact with the first spacer on the second transistor, wherein a spacer corresponding to the second spacer on the first transistor is absent from the second transistor and a spacer corresponding to the second spacer on the second transistor is absent from the first transistor.

BRIEF DESCRIPTION OF THE DRAWINGS

The disclosure may be understood by reference to the following description taken in conjunction with the accompanying drawings, in which like reference numerals identify like elements, and in which:

FIGS. 3A-3L depict one illustrative prior art process flow for forming a CMOS based integrated circuit product;

Figure 1:
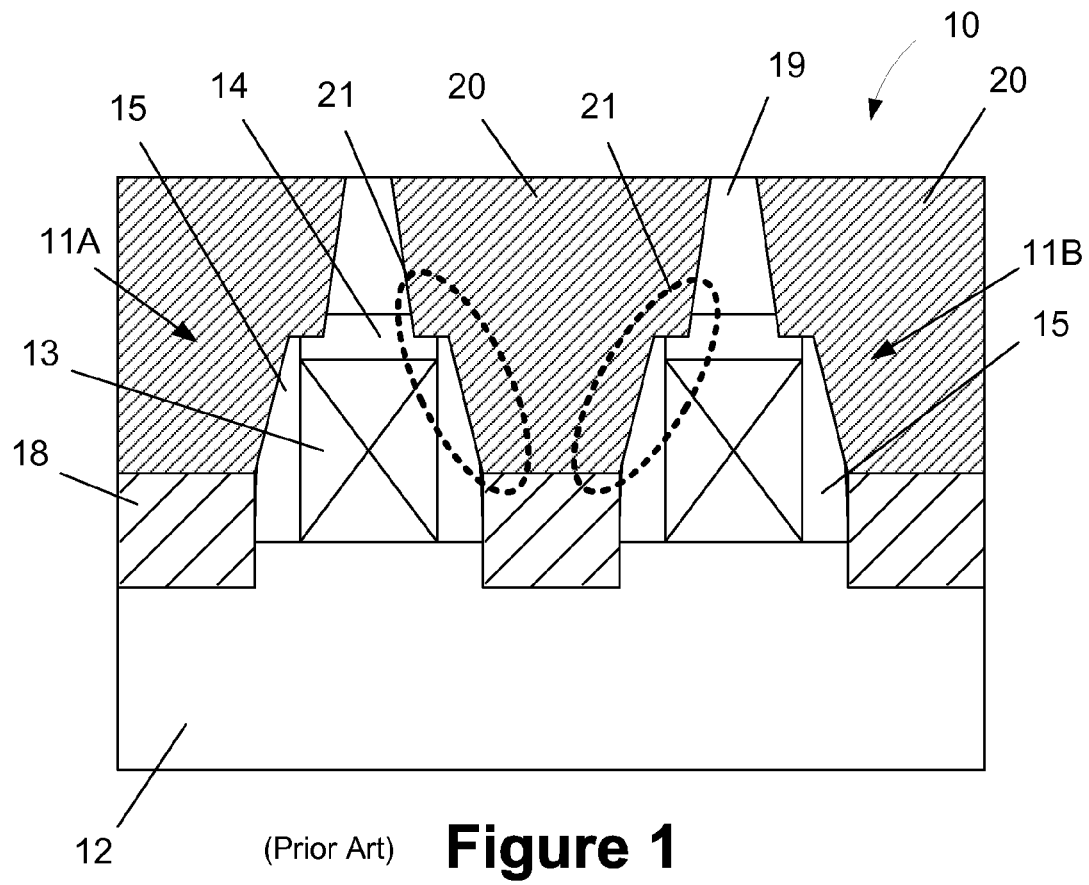
FIG. 1 depicts an illustrative prior art transistor device.
Figure 2A:
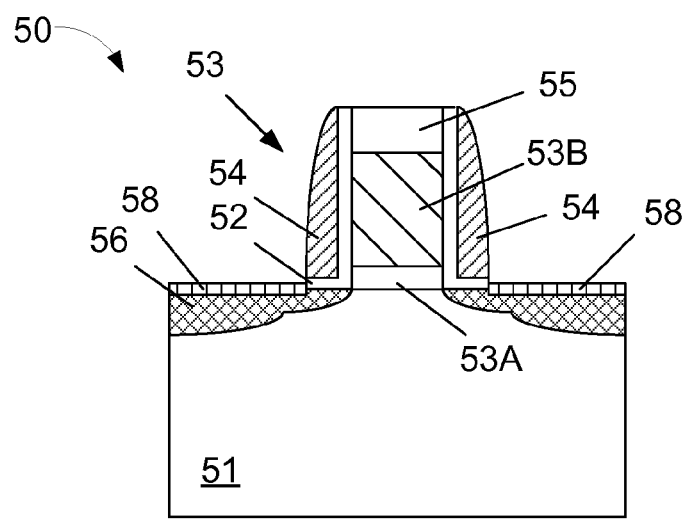
FIGS. 2A-2C depict one illustrative process flow for forming low-k spacers on transistor devices.
Figure 2B:
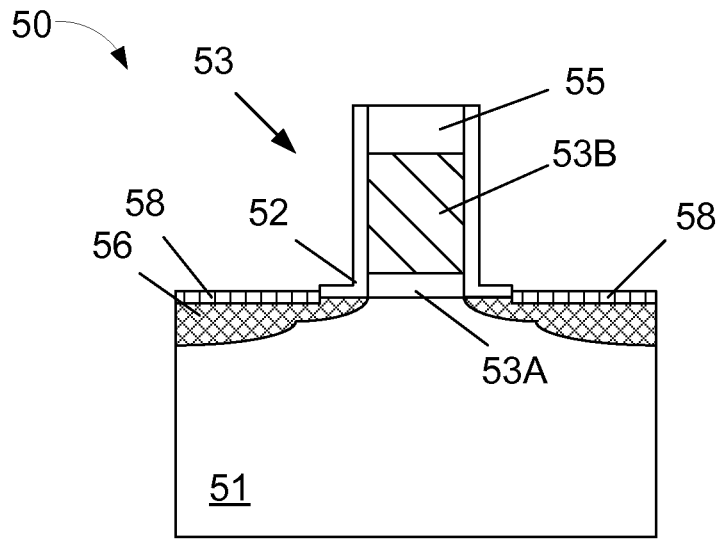
Figure 2C:
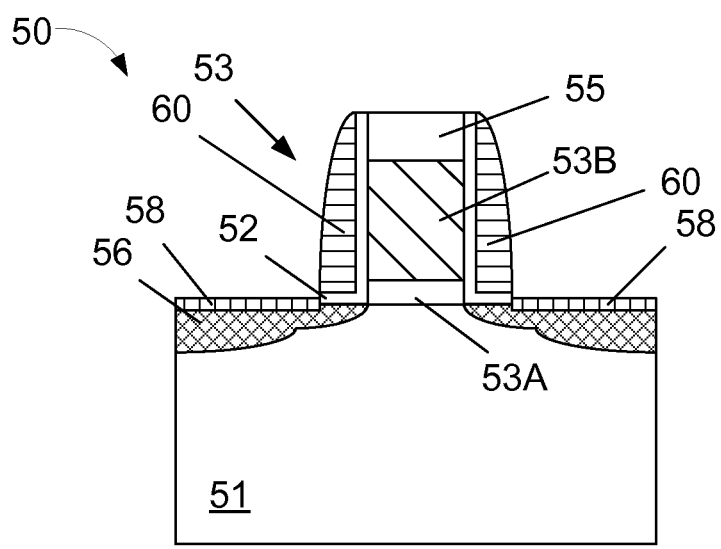
Figure 3G:
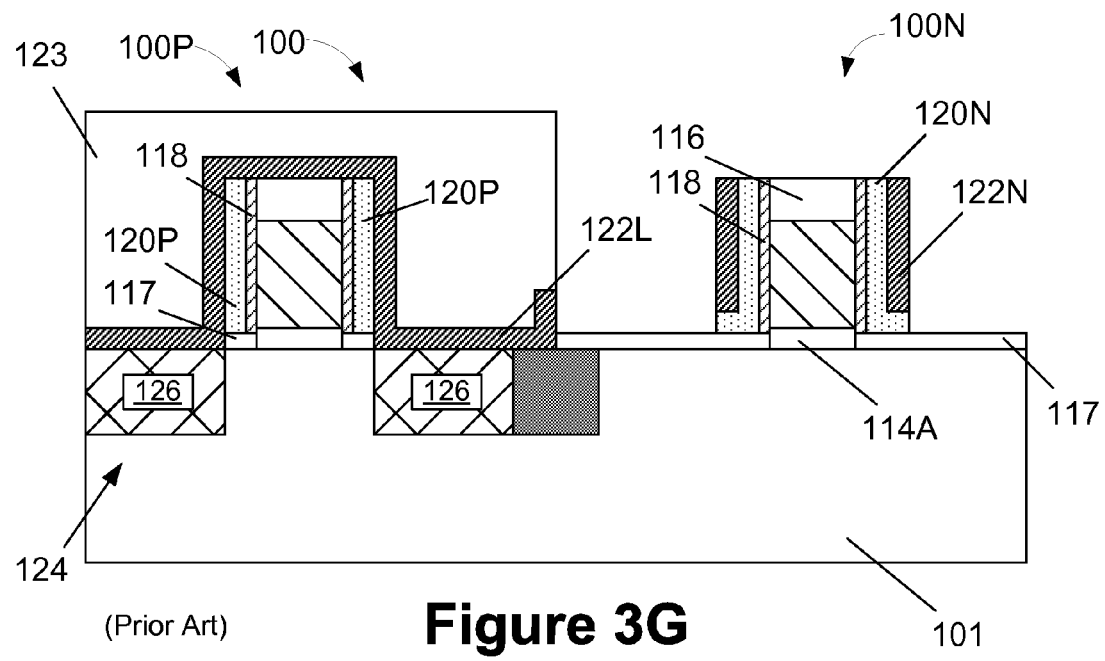
Figure 3H:
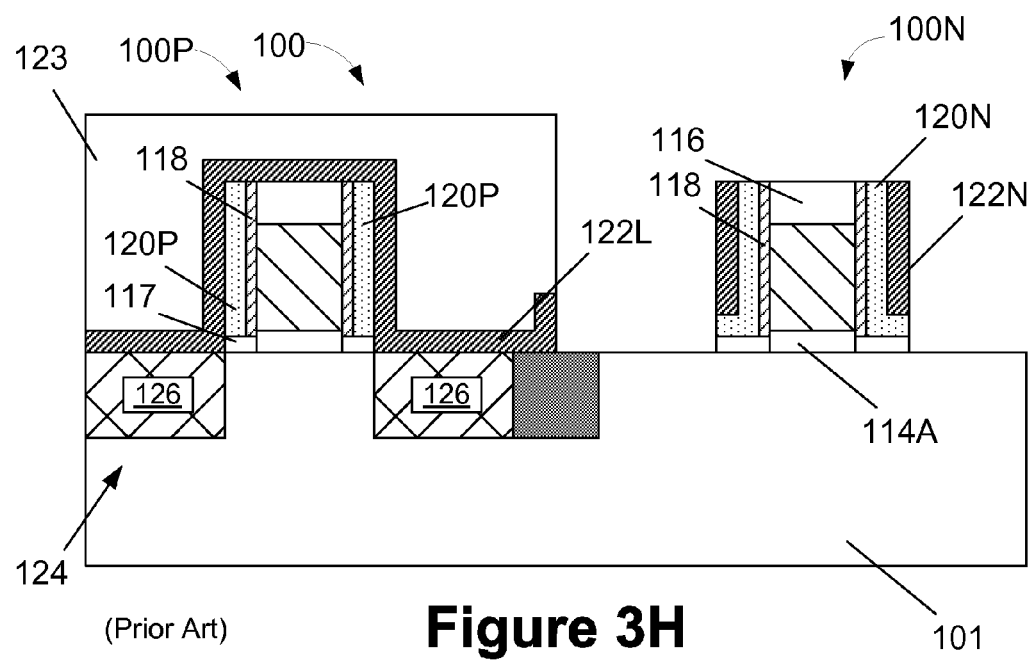

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming sidewall spacers in CMOS based integrated circuit products. As will be readily apparent to those skilled in the art upon a complete reading of the present application, the methods disclosed herein may be employed in manufacturing a variety of different products, including, but not limited to, logic products, memory products, etc. With reference to the attached figures, various illustrative embodiments of the methods and devices disclosed herein will now be described in more detail.

Figure 4A:
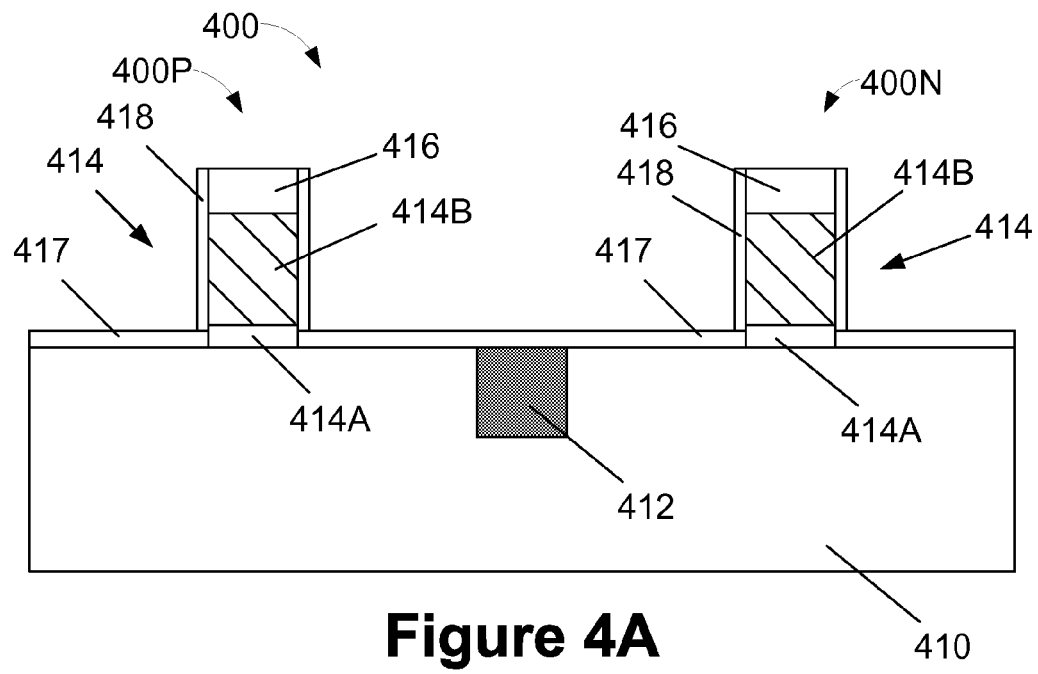
FIGS. 4A-4K depict various illustrative examples of using the methods disclosed herein for forming reduced thickness sidewall spacers in CMOS based integrated circuit products.

FIGS. 4A-4K depict various illustrative examples of using the methods disclosed herein for forming reduced thickness sidewall spacers in CMOS based integrated circuit products. FIG. 4A is a simplified view of an illustrative integrated circuit product 400 at an early stage of manufacture. The semiconductor product 400 includes an illustrative PMOS transistor 400P and an illustrative NMOS transistor 400N that are formed in and above a semiconductor substrate 410, i.e., the product 400 is comprised of a transistor of a first type and a transistor of a second type that is opposite to the first type. In the illustrative process flow depicted in FIGS. 4A-4K, the PMOS transistor 400P will be processed first to form a reduced thickness spacer on the PMOS device and thereafter a reduced thickness spacer will be formed on the NMOS transistor 400N. Of course, as will be recognized by those skilled in the art after a complete reading of the present application, the process flow may be essentially reversed wherein the NMOS transistor 400N is processed first to form a reduced thickness spacer on the NMOS device and thereafter a reduced thickness spacer will be formed on the PMOS device 400P. The substrate 410 may have a variety of configurations, such as the depicted bulk silicon configuration. The substrate 410 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 410 may also be made of materials other than silicon.

As shown in FIG. 4A, the process begins with the formation of illustrative gate structures 414 for the PMOS transistor 400P and the NMOS transistor 400N in and above regions of the substrate 410 that are separated by an illustrative shallow trench isolation structure 412. Also depicted in FIG. 4A is an illustrative layer 417, made of a material such as silicon dioxide, e.g., a pad oxide layer. The gate structures depicted in FIG. 4A may be formed by performing a variety of known techniques. For example, using a so-called "gate first" manufacturing technique, the layers of material that make up the gate insulation layer 414A, the gate electrode layer 414B and the gate cap layer 416 may be blanket-deposited (or grown) above the substrate 410 and, thereafter, one or more etching processes may be performed through a patterned etch mask layer (not shown) to define the basic gate structures depicted in FIG. 4A. Of course, the gate structures 414 could also be sacrificial gate structures (that will be subsequently replaced) in the case where a replacement gate process is used to manufacture the product 400. As will be recognized by those skilled in the art after a complete reading of the present application, the gate structures 414 may be of any desired construction and comprised of any of a variety of different materials, such as one or more conductive layers made of polysilicon or a metal, etc., and one or more layers of insulating material, such as silicon dioxide, a high-k material, etc. Additionally, the gate structure 414 for the NMOS transistor 400N may have different material combinations as compared to a gate structure 414 for the PMOS transistor 400P. Thus, the particular details of construction of gate structure 414, and the manner in which the gate structures 414 are formed, should not be considered a limitation of the present invention.

For example, the gate structures 414 may be the final gate structures for the devices that are manufactured using the so-called "gate-first" manufacturing techniques, or they may be dummy gate structures when the devices are manufactured using so-called "gate-last" manufacturing techniques. Additionally, to the extent that reference to the various structures in each of the individual devices 400P, 400N are made, such reference will be made using terminology such as "NMOS gate structure," "PMOS gate structure," "NMOS spacers," "PMOS spacers," "NMOS cavities," "PMOS cavities," etc. and the like along with reference numbers using "P" or "N" suffixes.

FIG. 4A also depicts the product 400 after a low-k sidewall spacer 418 ("spacer 1") was formed adjacent the gate structures 414 of both the PMOS transistor 400P and the NMOS transistor 400N. Typically, a thin interfacial silicon dioxide layer (not shown) may be formed on the gate structures 414 prior to the formation of the spacers 418. The low-k spacers 418 may be made of a variety of materials having a k-value less than 7.8 (the k value of traditional silicon nitride), such as SiCON, carbon or boron doped silicon nitride, materials comprised of organosilicate glass (OSG), fluorine doped $SiO_2$, carbon doped $SiO_2$, porous $SiO_2$, porous carbon doped $SiO_2$, spin-on organic polymeric dielectrics, hydrogen silsesquioxane (HSQ), methylsilsesquioxane (MSQ) or combinations of such materials, etc. The low-k spacers 418 have an illustrative base width of about 10-12 nm. The low-k spacers 418 may be formed by depositing a layer of spacer 1 material and thereafter performing an anisotropic etching process. Before or after the low-k spacer 418 is formed, various ion implant processes may be performed on the devices 400N, 400P, e.g., source/drain extension implants (not shown), halo implants (not shown), etc. In one embodiment, the spacers 418 are made from a material that exhibits the toughness of silicon nitride (i.e., mechanically strong, substantially non-porous, and substantially pin-hole free, etc.), but has a k value less than the 7.8 k value of silicon nitride. Accordingly, in one particular example, SiOCN may be a good selection for the spacer 1 material.

Figure 4B:
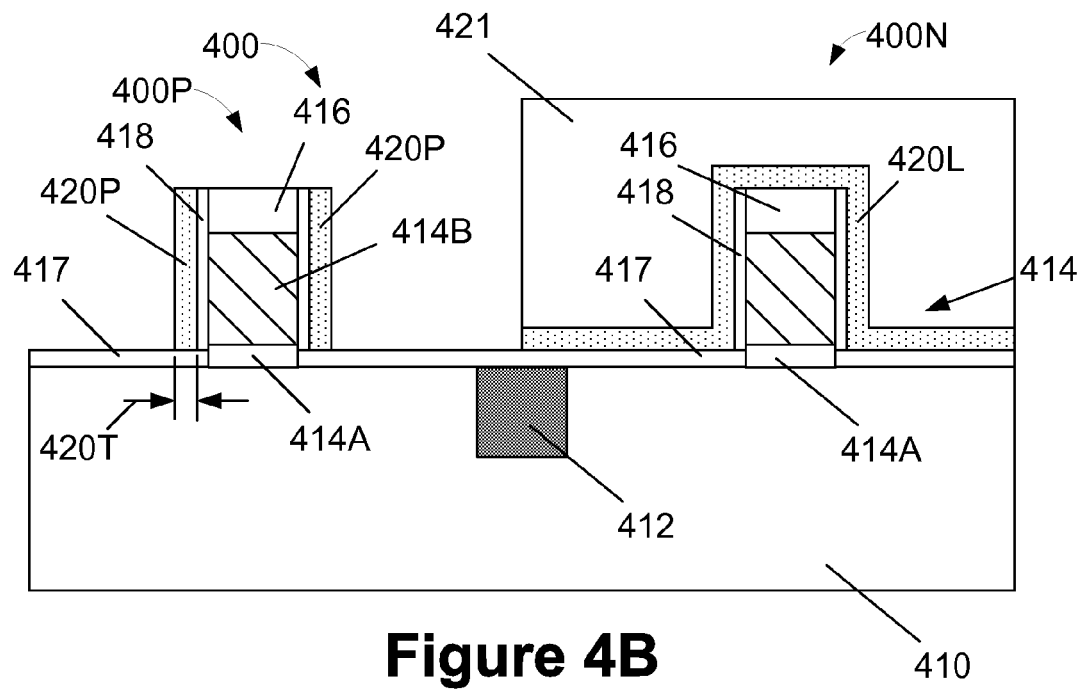

FIG. 4B depicts the product 400 after several process operations were performed to form an initial PMOS sidewall spacer 420P ("spacer 2") adjacent the spacer 418 of the PMOS transistor 400P. First, a layer of spacer 2 material 420L was deposited above both the PMOS transistor 400P and the NMOS transistor 400N. Thereafter, an etch mask layer 421, such as photoresist, was formed so as to cover the NMOS transistor 400N while exposing the PMOS transistor 400P. Next, an anisotropic etching process was performed on the exposed portion of the layer of spacer 2 material 420L so as to define the initial PMOS sidewall spacer 420P (spacer 2 for the PMOS device). The initial PMOS sidewall spacer 420P may have an illustrative base width 420T of about 10-15 nm. After the initial spacer 420P is formed, various ion implant processes may be performed on the PMOS transistor 400P to form various doped regions (not shown) in the substrate 410, e.g., halo implant regions. In one illustrative embodiment, the spacer 2 material may be made of silicon nitride.

Figure 4C:
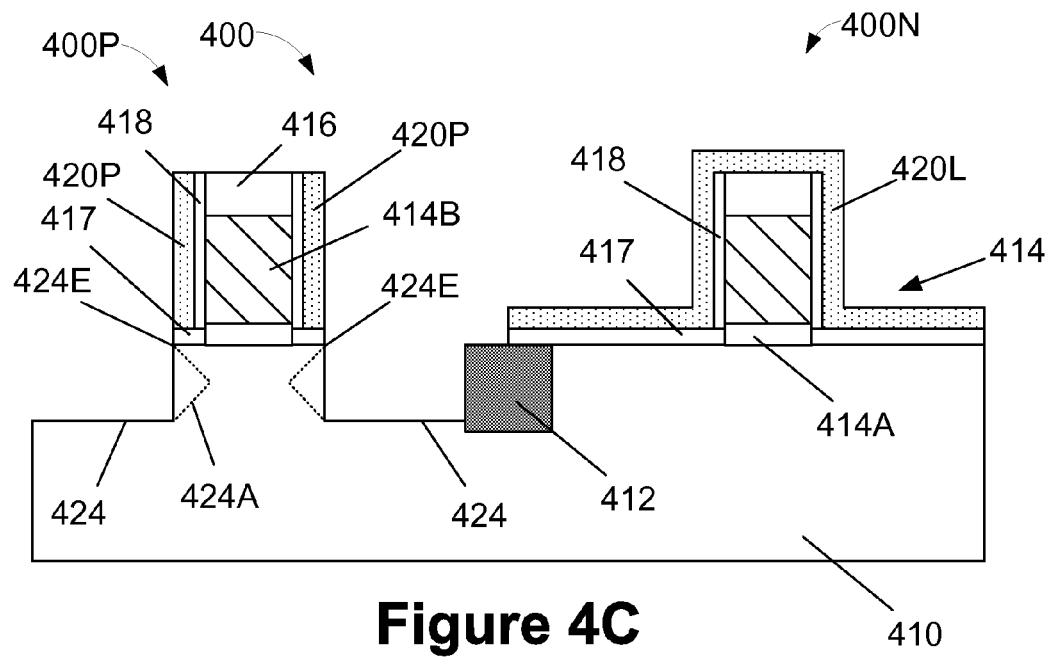

FIG. 4C depicts the product 400 after several process operations were performed. First, an anisotropic etching process was performed through the etch mask layer 421 to remove exposed portions of the layer 417 on the PMOS transistor 400P. Next, the etch mask layer 421 was removed by performing an ashing process. Then, one or more etching processes were performed to define PMOS source/drain cavities 424 in areas of the substrate 410 where source/drain regions for the PMOS transistor 400P will ultimately be formed. The depth and shape of the PMOS source/drain cavities 424 may vary depending upon the particular application. For example, the PMOS source/drain cavities 424 may have a so-called "Sigma" shape, as reflected by the dashed line 424A. In one example, the PMOS source/drain cavities 424 may have an overall depth of about 70 nm. Note that, during these etching processes that are performed to form the PMOS source/drain cavities 424, the low-k spacer 418 is protected by the initial spacer 420P and the remaining portions of the layer of spacer 2 material 420L remain positioned above the NMOS transistor 400N. Also note that at least the uppermost inner edge 424E of the PMOS source/drain cavities 424 is substantially aligned with the initial second sidewall spacer 420P at the surface of the substrate 410.

Figure 4D:
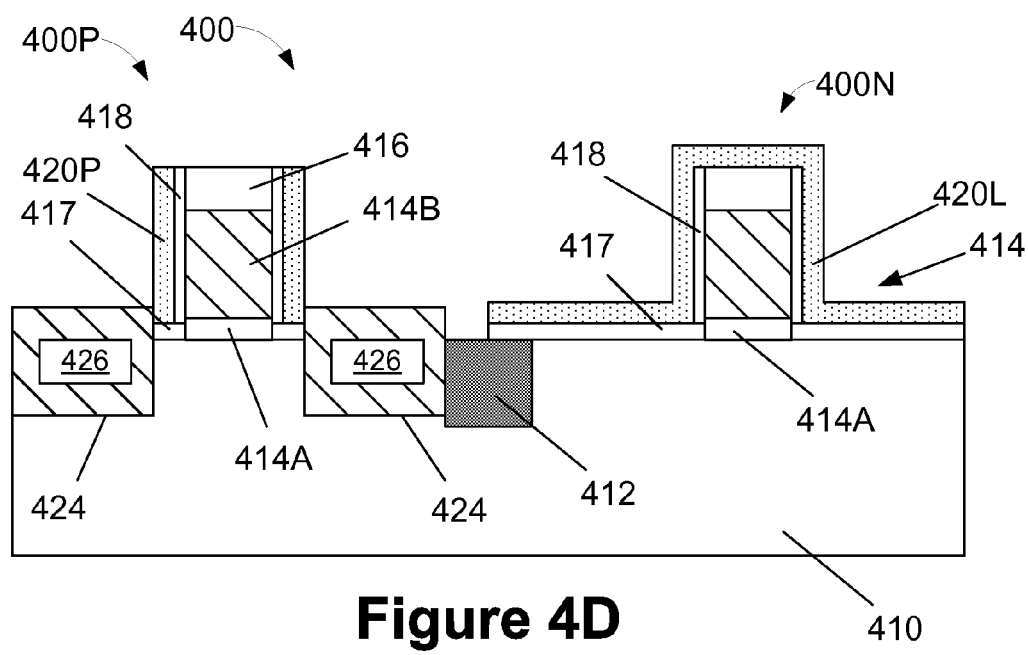

FIG. 4D depicts the product 400 after an epitaxial deposition process was performed to form PMOS epitaxial semiconductor material regions 426 (e.g., silicon germanium regions) in the PMOS source/drain cavities 424. In the depicted example, the PMOS source/drain regions 426 define raised/source drain regions that have an upper surface that is positioned at a level that is above the upper surface of the substrate 410. The PMOS epi regions 426 may be formed by performing well known epitaxial deposition processes. Note that the low-k spacer 418 in the PMOS region is protected by the initial spacer 420P and in the NMOS region by the remaining portions of the layer of spacer 2 material 420L during any epi pre-clean process and during the actual epi deposition process that is performed to form the PMOS epitaxial semiconductor material regions 426. The epi PMOS regions 426 may be doped with a P-type dopant during the formation of the epi regions 426 (i.e., in situ doping), or the epi PMOS regions 426 may be formed as initially undoped epi material and P-type dopants may be introduced into the epi material by performing one or more ion implantation processes.

Figure 4E:
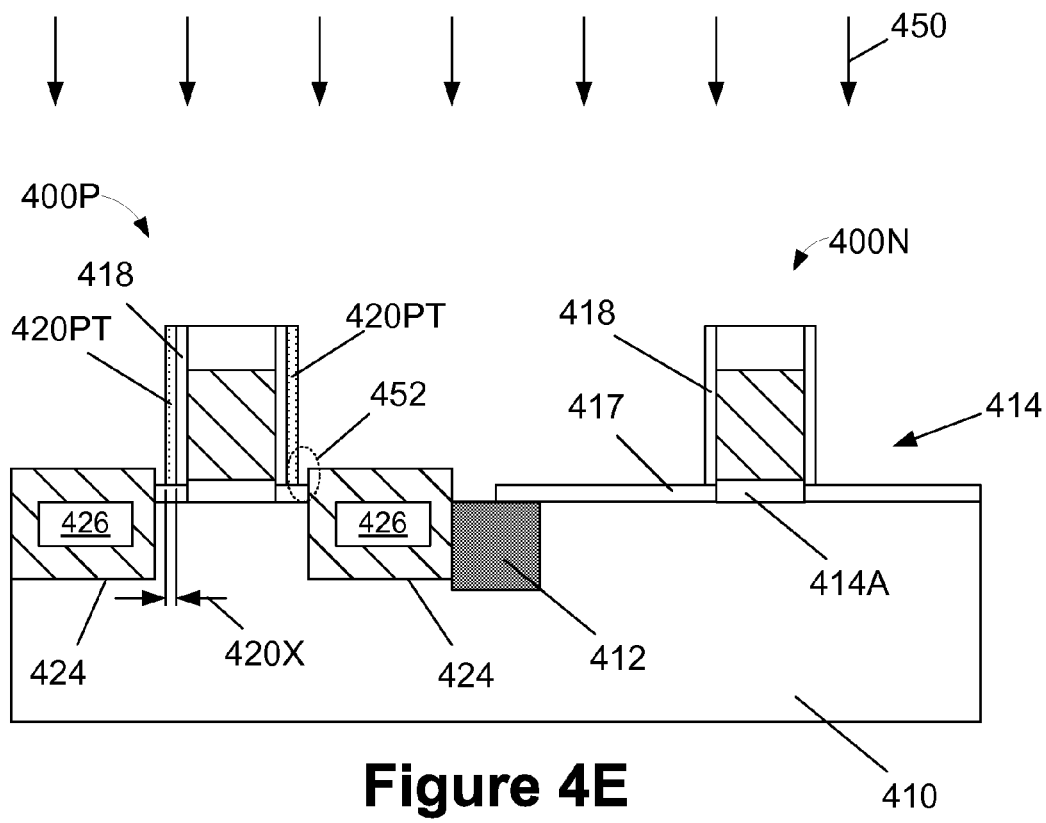

FIG. 4E depicts the product 400 after a timed, wet etching process 450 was performed on both devices to remove the spacer 2 material layer 420L entirely from the NMOS transistor 400N while leaving a portion of the original initial spacer 420P in the PMOS transistor 400P, i.e., the process results in the formation of a reduced thickness second spacer 420PT only adjacent the PMOS device 400P and the exposure of the low-k spacer 418 of the NMOS transistor 400N. In some embodiments, the reduced thickness second spacer 420PT may have a base width or thickness 420X that is approximately 30-50% of the base thickness 420T of the original initial second spacer 420P. In one example, reducing the thickness of the original initial second spacer 420P results in the formation of a gap 452 between the reduced thickness second spacer 420PT and the epi PMOS source/drain regions 426. The lateral width of the gap 452, when present, generally corresponds to the amount of thinning of the original second spacer 420P. In other applications, the etching process 450 may remove more of the material of the initial spacer 420P near the upper portion of the initial spacer 420 and very little of the initial spacer 420P may be consumed in the area immediately adjacent the epi PMOS source/drain regions 426, i.e., the gap 452 may not be present. As described more fully below, by forming the reduced thickness second spacer 420PT, an insulating material with a lower k value than that of the material of the initial spacer 420P (e.g., silicon nitride), such as silicon dioxide, may be positioned in the area formerly occupied by the removed portions of the initial spacer 420P. As a result, the capacitive coupling between the gate 414 on the PMOS transistor 400P and a source/drain contact structure (not shown) may be less as compared to prior art devices. Additionally, forming the reduced thickness spacer 420PT makes the process of properly contacting the epi PMOS source/drain regions 426 easier as compared to prior art processing techniques.

The inventors have discovered that by properly performing the timed, wet etching process 450, spacer 2 material layer 420L may be completely removed from the NMOS transistor 400N while only removing a portion of the initial spacer 420P from the PMOS transistor. Wet etching characteristics (etch rate, uniformity, selectivity, etc.) are determined, at least in part, by the surface properties of the materials exposed to the wet etching process and the etchant solutions. In general, wettability is a term that describes the degree or extent to which a material absorbs or can be made to absorb moisture, e.g., water. The degree of wetting (wettability) is determined by a force balance between adhesive and cohesive forces. The contact angle between a liquid droplet (e.g., water) on a smooth solid surface is one visible illustration of the forces at the interface between the liquid and the solid material and the cohesive forces within the liquid. In general, hydrophobic materials have little or no affinity for a liquid, such as water, while hydrophilic materials have a strong affinity for a liquid. According to one reference, etched silicon has a water contact angle of about 86-88°, while silicon nitride has a water contact angle of about 28-30°. Arkles, *Paintings & Coatings Industry Magazine*, FIG. 4, October 2006 (the entire Arkles article is hereby incorporated by reference). Thus, etched silicon material is, relative to silicon nitride, a hydrophobic material since it has a greater contact angle with water. Stated the opposite way, silicon nitride is, relative to etched silicon, a hydrophilic material since it has a smaller contact angle with water. While the inventors do not have wettability data for silicon dioxide, it is known that, relative to etched silicon, silicon dioxide would also have a lower contact angle, i.e., silicon dioxide is, relative to etched silicon, a hydrophilic material. An etching process can be impacted by localized material conditions, e.g., so-called etch loading effects. During the etching process 450, the presence of the epi PMOS semiconductor material 426 (a hydrophobic material) adjacent the original spacer 420P (a hydrophilic material such as silicon nitride) in the PMOS transistor 400P means that the etching process 450 is less effective in the area of the PMOS transistor 400P, particularly in the area where the initial spacer 420P is positioned close to the hydrophobic material—the epi PMOS source/drain regions 426. In contrast, there is no such epi material present in the NMOS transistor 400N at the time the etching process 450 is performed. That is, since the spacer 2 material layer 420L over the NMOS transistor 400N is a hydrophilic material such as silicon nitride that is positioned adjacent the insulating material layer 417 (e.g., silicon dioxide—a hydrophilic material) and the substrate 410 (a hydrophobic material) remains covered in the NMOS region, the etching process 450 readily removes all of the spacer 2 material layer 420L from the NMOS transistor 400N. In one illustrative embodiment, where the initial spacer 420P (and spacer 2 material layer 420L) is made of silicon nitride, the etching process 450 may be performed using $H_3PO_4$ as the etchant, and the etching process 450 may be performed at a temperature of about 140-200° C. for a duration of about 30-120 seconds. Of course, the conditions and parameters of the etching process 450 may vary depending upon the particular application, e.g., the concentration and temperature of $H_3PO_4$ solution, the thickness of the initial spacer 420P, the desired amount of thinning of the initial spacer 420P, etc. Furthermore, $H_3PO_4$ is an etching solution that exhibits a relatively high etch rate for silicon nitride (i.e., SiN fast etch selectivity) when silicon nitride is selectively etched with respect to materials such as silicon, silicon dioxide, SiOC or SiOCN. Thus, in one particular embodiment, the spacer 2 and spacer 3 (discussed below) materials may be made of silicon nitride, while the spacer 1 material may be made of silicon dioxide or SiOCN.

Figure 4F:
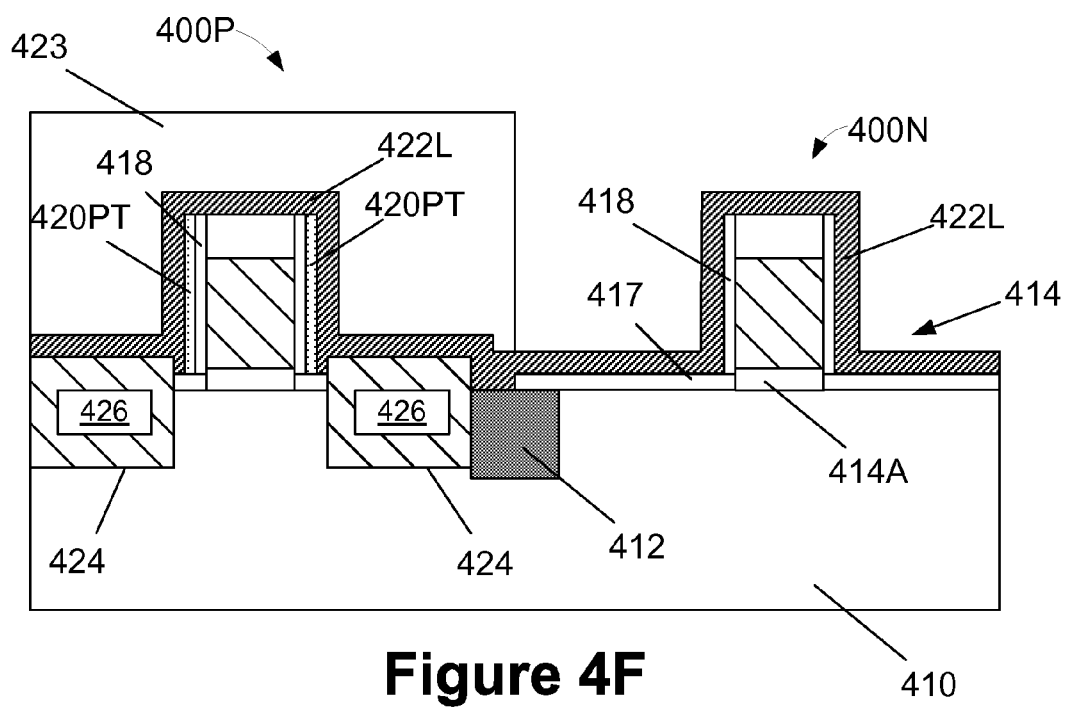

FIG. 4F depicts the product 400 after several process operations were performed. First, a layer of spacer 3 material 422L was deposited above both the PMOS transistor 400P and the NMOS transistor 400N. Thereafter, an etch mask layer 423, such as photoresist, was formed so as to cover the PMOS transistor 400P while exposing the NMOS transistor 400N.

Figure 4G:
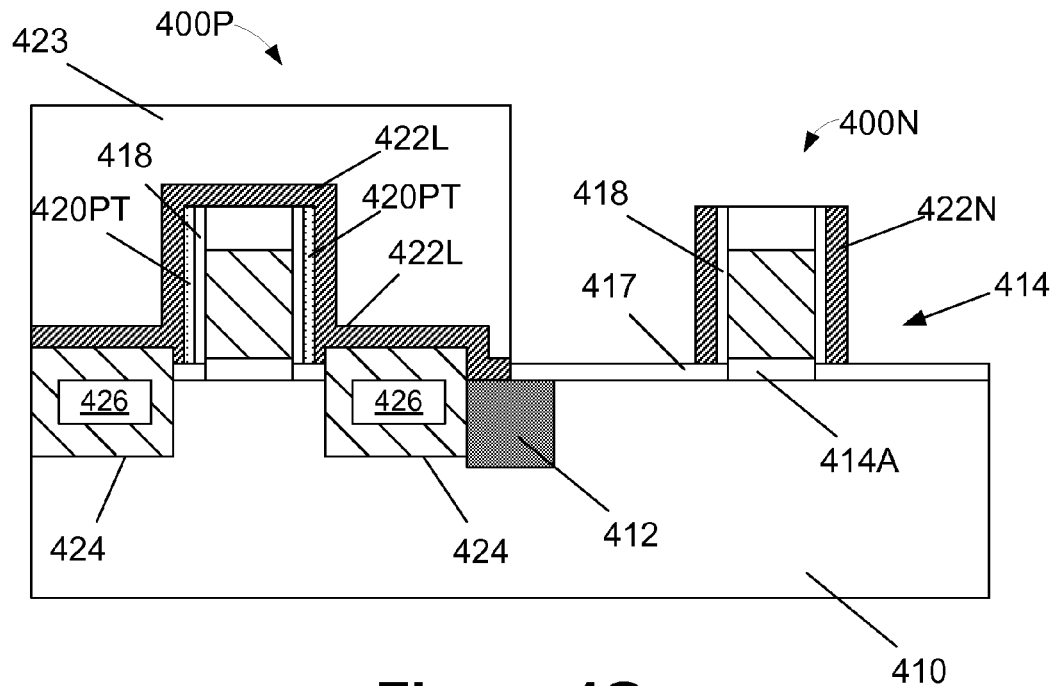

FIG. 4G depicts the product 400 after an anisotropic etching process was performed through the etch mask layer 423 to form an initial NMOS sidewall spacer 422N ("spacer 3") adjacent the spacer 418 of the NMOS transistor 400N. The initial spacer 422N may have an illustrative base width or thickness of about 10-20 nm. The initial spacer 422N may be made of silicon nitride, etc. The initial spacer 422N may have an illustrative base width or thickness of about 10-20 nm.

Figure 4H:
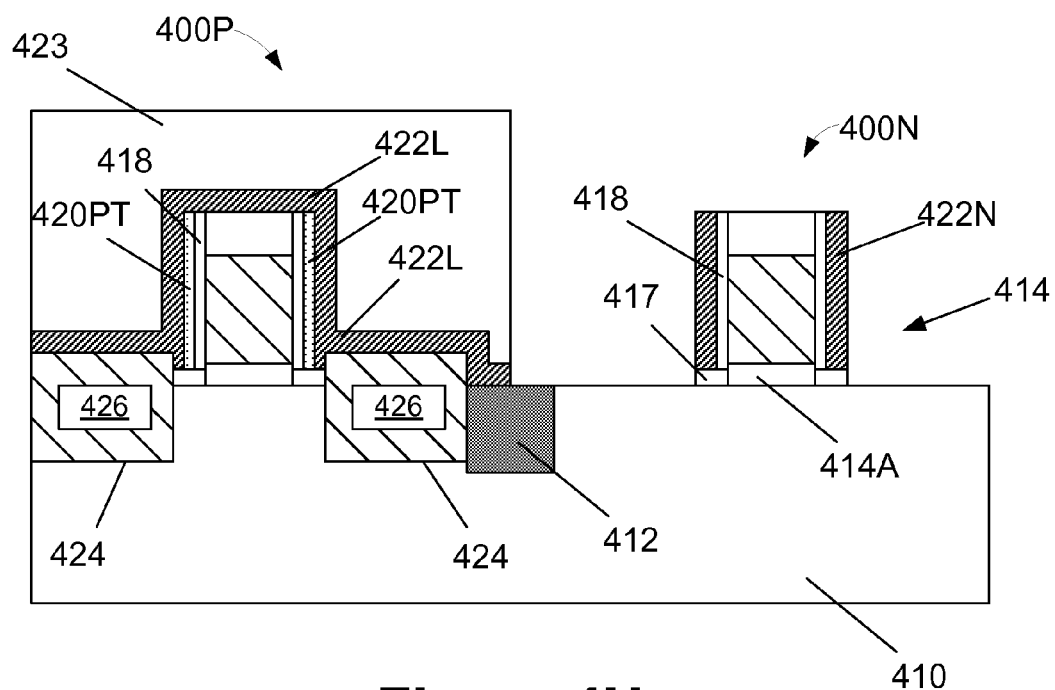

FIG. 4H depicts the product 400 after an anisotropic etching process was performed through the etch mask layer 423 to remove exposed portions of the layer 417 on the NMOS transistor 400N.

Figure 4I:
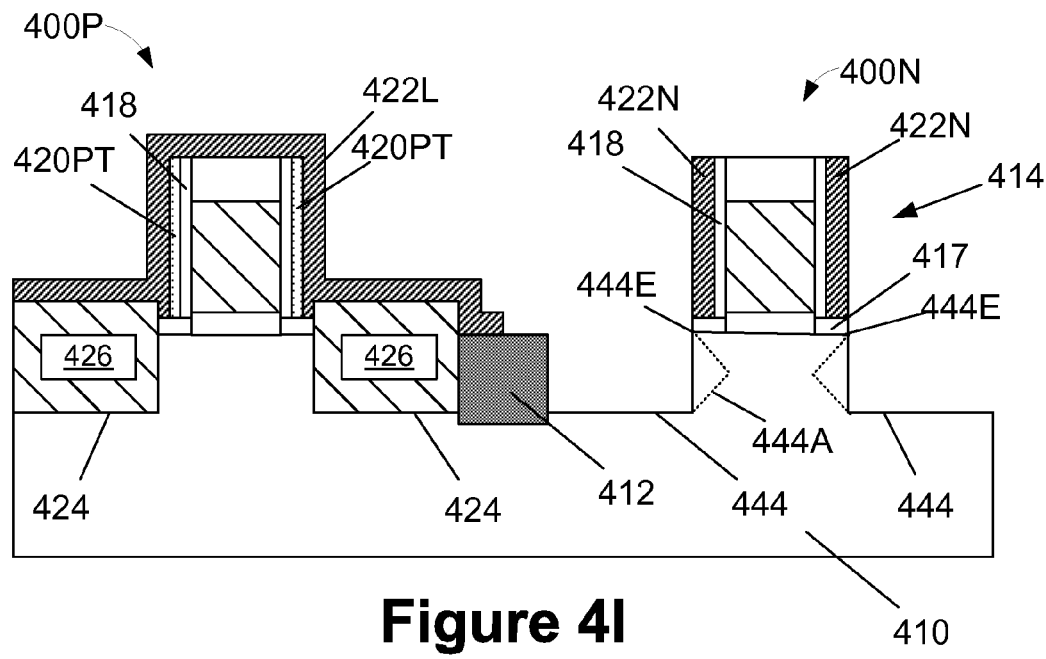

FIG. 4I depicts the product 400 after several process operations were performed. First, the etch mask 423 was removed by performing an ashing process. Then, one or more etching processes were performed to define NMOS source/drain cavities 444 in areas of the substrate 410 where source/drain regions for the NMOS transistor 400N will ultimately be formed. The depth and shape of the NMOS source/drain cavities 444 may vary depending upon the particular application. For example, the NMOS source/drain cavities 444 may have a so-called "Sigma" shape, as reflected by the dashed line 444A. In one example, the NMOS source/drain cavities 444 may have an overall depth of about 70 nm. Note that, during these etching processes that are performed to define the NMOS source/drain cavities 444, the low-k spacer 418 is protected by the initial spacer 422N and the remaining portions of the layer of spacer 3 material 422L remain positioned above the PMOS transistor 400P. Also note that at least the uppermost inner edge 444E of the NMOS source/drain cavities 444 is substantially aligned with the initial spacer 422N at the surface of the substrate 410.

Figure 4J:
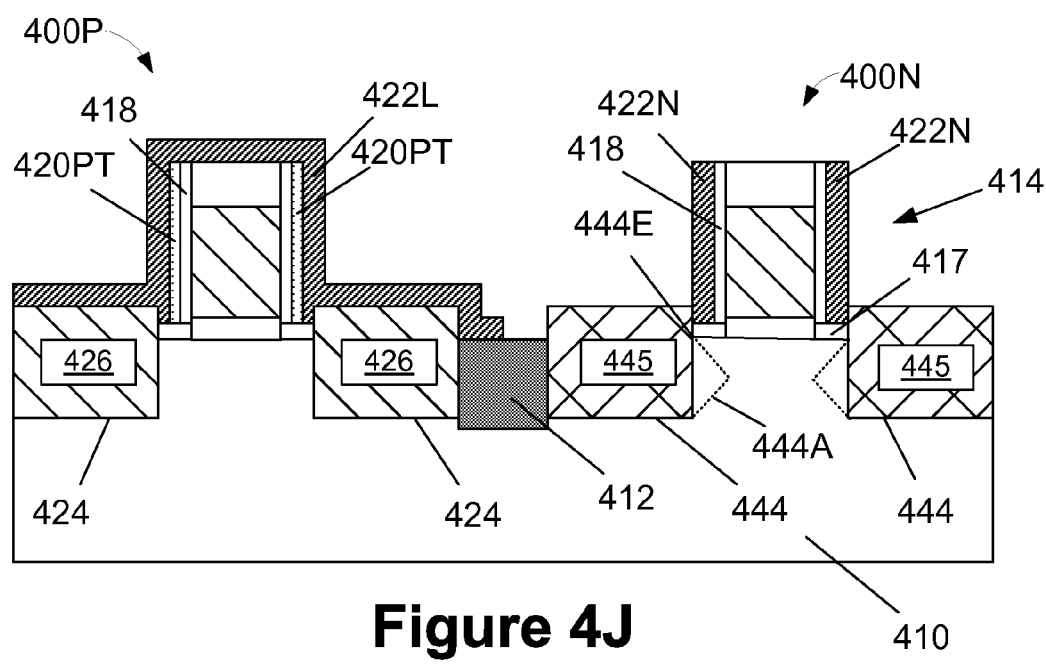

FIG. 4J depicts the product 400 after an epitaxial deposition process was performed to form epitaxial NMOS semiconductor material regions 445 (e.g., silicon carbon regions) in the NMOS source/drain cavities 444. In the depicted example, the NMOS source/drain regions 445 define raised/ source drain regions that have an upper surface that is positioned at a level that is above the upper surface of the substrate 410. The epi NMOS source/drain regions 445 may be formed by performing well known epitaxial deposition processes. Note that the low-k spacer 418 in the NMOS region is protected by the initial spacer 422N and in the PMOS region by the remaining portions of the layer of spacer 3 material 422L during any epi pre-clean process and during the actual epi deposition process that is performed to form the epitaxial NMOS source/drain regions 445. The epi NMOS source/ drain regions 445 may be doped with an N-type dopant during the formation of the epi NMOS source/drain regions 445 (i.e., in situ doping), or the epi NMOS source/drain regions 445 may be formed as initially undoped epi material and N-type dopants may be introduced into the epi NMOS material by performing one or more ion implantation processes.

Figure 4K:
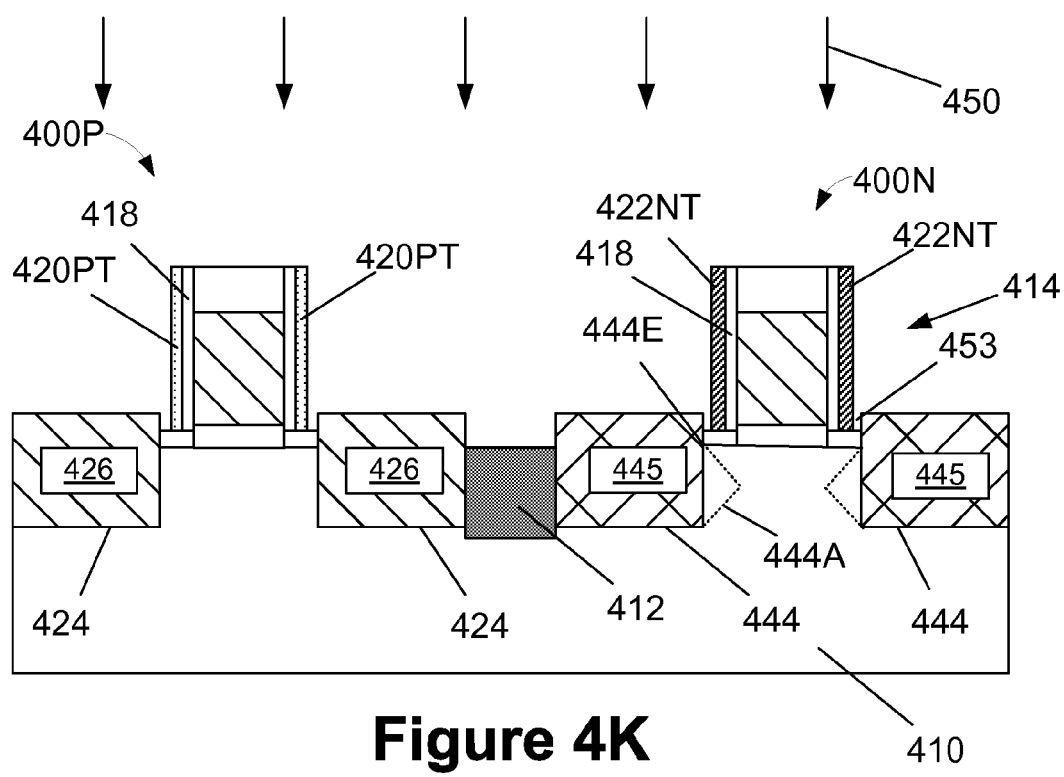

FIG. 4K depicts the product 400 after the above-described etching process 450 was performed on both devices to remove the remaining portions of the layer of spacer 3 material 422L from the PMOS transistor 400P while leaving the thinner spacer 420PT on the PMOS device. During the etching process 450, the removal of the layer of spacer 3 material 422L from above the epi PMOS source/drain regions 426 exposes the relatively hydrophobic surfaces of the epi PMOS regions 426. As a result, the etching of the spacer 420PT on the PMOS device 400P slows down. Similarly, performing the etching process 450 also results in the formation of a reduced thickness third spacer 422NT positioned on the low-k spacer 418 of the NMOS transistor 400N. In some embodiments, the reduced thickness third spacer 422NT may have a base width or thickness that is approximately 30-50% of the base thickness of the initial NMOS sidewall spacer 422N. In one example, reducing the thickness of the initial NMOS sidewall spacer 422N results in the formation of a gap 453 between the reduced thickness third spacer 422NT and the epi NMOS source/drain regions 445. The lateral width of the gap 453, when present, generally corresponds to the amount of thinning of the initial NMOS sidewall spacer 422N. In other applications, the etching process 450 may remove more of the material of the initial NMOS sidewall spacer 422N from the upper portion of the initial NMOS sidewall spacer 422N and very little of the initial NMOS sidewall spacer 422N may be consumed in the area immediately adjacent the epi NMOS source/drain regions 445. As described more fully below, by forming the reduced thickness third spacer 422NT, an insulating material with a lower k value than that of the material of the original NMOS sidewall spacer 422N (e.g., silicon nitride) may be positioned in the area formerly occupied by the removed portions of the initial NMOS sidewall spacer 422N. As a result, the capacitive coupling between the gate 414 on the NMOS transistor 400N and a source/drain contact structure (not shown) may be less as compared to prior art devices. Additionally, forming the reduced thickness third spacer 422NT makes the process of properly contacting the epi NMOS source/drain regions 445 easier as compared to prior art processing techniques.

As depicted in FIG. 4K, two PMOS spacers are positioned on the PMOS transistor 400P—the low-k spacer 418 and the reduced thickness second spacer 420PT that is positioned on and in contact with the low-k spacer 418 of the PMOS transistor 400P. Similarly, two NMOS spacers are positioned on the NMOS transistor 400N—the low-k spacer 418 and the spacer 422NT that is positioned on and in contact with the low-k spacer 418 of the NMOS transistor 400N in the illustrative example depicted herein. Due to the formation of the reduced thickness second spacer 420PT on the PMOS transistor 400P (and not forming a spacer corresponding to 420P or 420PT on the NMOS transistor) and forming the reduced thickness third spacer 422NT on the NMOS transistor 400N (and not having a spacer corresponding to the spacers 422N or 422NT on the PMOS transistor 400P), the method disclosed herein provides significant benefits. That is, by employing the methods disclosed herein, a material (such as silicon dioxide) having a k-value less than the k value of the material (such as silicon nitride) of the reduced thickness spacers 420PT, 422NT may be positioned between source/drain contact structures (not shown) and the gate structures of the devices 400P, 400N, thereby reducing capacitive coupling between the gate of the devices. Additionally, the formation of the reduced thickness spacers 420PT, 422NT and the formation of fresh replacement low-k material between the gates and a contact structure on the epi PMOS source/drain regions 426, 445 of the devices results in a more defect free structure between the gates and the source/drain contacts (e.g., porous and substantially pin-hole free) that is subjected to less contamination and implantation damage. At the point of fabrication shown in FIG. 4K, various process operations may be performed to complete the manufacture of the product 400, e.g., silicide formation, contact formation, formation of metallization layers, etc.

Figure 5A:
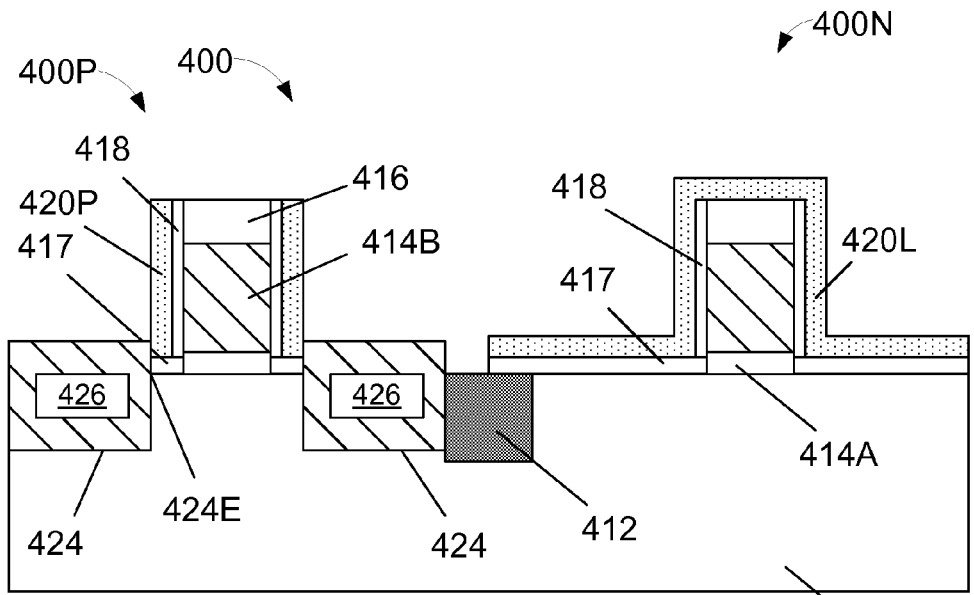
FIGS. 5A-5I depict other illustrative examples of using the methods disclosed herein for forming CMOS based integrated circuit products using disposable spacers.

FIGS. 5A-5I depict other illustrative examples of using the methods disclosed herein for forming CMOS based integrated circuit products using disposable spacers. As before, the depicted process flow may be essentially reversed, i.e., the epi source/drain regions 445 (and the associated spacers) on the NMOS transistor 400N may be formed prior to the formation of the epi source/drain regions 426 (and the associated spacers) on the PMOS transistor. FIG. 5A depicts the product 400 at a point in fabrication that corresponds to that shown in FIG. 4D, i.e., after the above-described low-k spacers 418 and the initial second spacer 420P was formed adjacent the gate structure 414 of the PMOS transistor 400P, and after the epi PMOS source/drain regions 426 were formed for the PMOS transistor 400P. Also note that at least the uppermost inner edge 424E of the PMOS source/drain cavities 424 is substantially aligned with the initial second sidewall spacer 420P at the surface of the substrate 410.

Figure 5B:
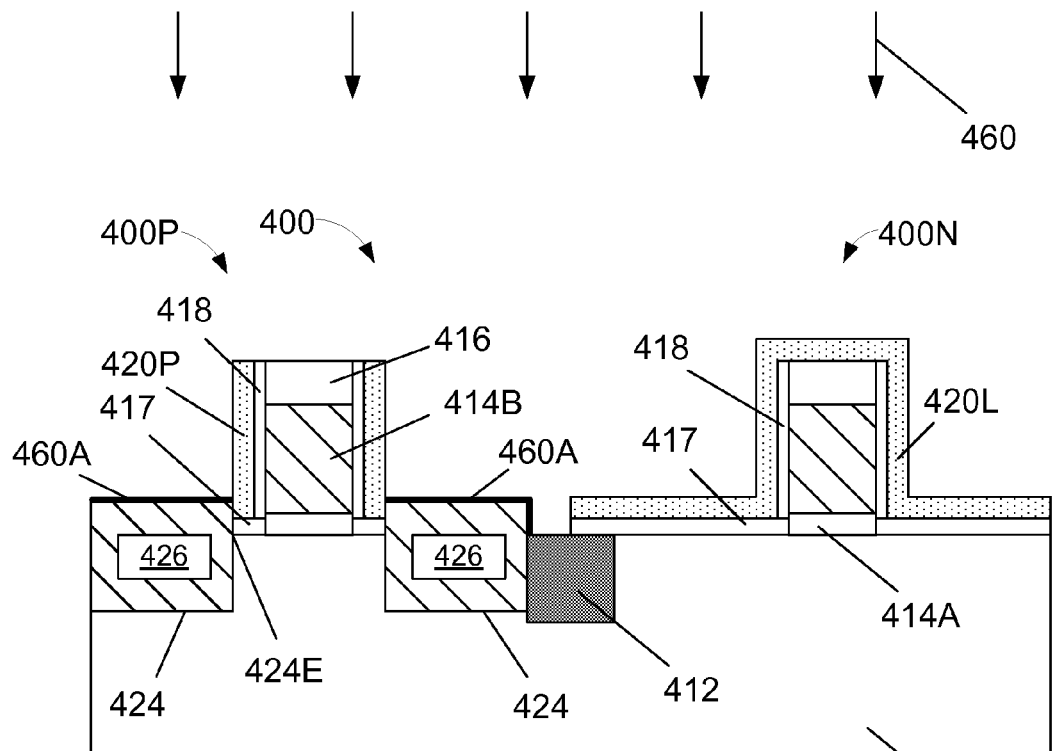

Next, as depicted in FIG. 5B, a surface oxidation process 460 was performed to form a hydrophilic surface material 460A on the exposed surfaces of the epi PMOS source/drain regions 426. The hydrophilic surface material 460A is hydrophilic in the sense that it is more hydrophilic than the epi semiconductor materials 426. In the depicted example, the surface oxidation process 460 is performed with the initial second sidewall spacer 420P in position on the PMOS transistor 400P and with the remaining portions of the layer of spacer 2 material 420L positioned above the NMOS transistor 400N. In the illustrative example depicted herein, the process operation 460 may be performed so as to form a substantially uniform layer of the hydrophilic surface material 460A, e.g., silicon dioxide, on the exposed surfaces of the epi semiconductor material 426.

In one illustrative embodiment, the process operation 460 may comprise performing an oxygen-based plasma treatment process on the product 400. The parameters of the oxygen-based plasma treatment process may vary depending upon the particular application. In one illustrative embodiment, the oxygen-based plasma treatment process may be performed at a temperature of, for example, room temperature to 80° C. in, for example, a plasma oxygen chamber. In general, the oxygen-based plasma treatment process will result in the formation of a thin layer of silicon dioxide 460A (e.g., less than about 2-3 nm) on the exposed surfaces of the epi source/drain regions 426. As noted above, silicon dioxide is, relative to the materials of the PMOS epi source/drain region 426, a more hydrophilic material. In another illustrative embodiment, the surface oxidation process 460 may comprise performing a wet cleaning process with a material such as SPM (sulfuric acid with hydrogen peroxide), or diluted SPM, etc. The wet cleaning process also results in the formation of a thin layer of hydrophilic silicon dioxide 460A on the exposed surfaces of the PMOS epi source/drain regions 426. The duration and temperature of the wet cleaning process may vary depending upon the particular application. In one illustrative embodiment, the wet cleaning process may be performed using SPM at a temperature within the range of about 90-140° C. for a duration of about 5-10 minutes.

Figure 5C:
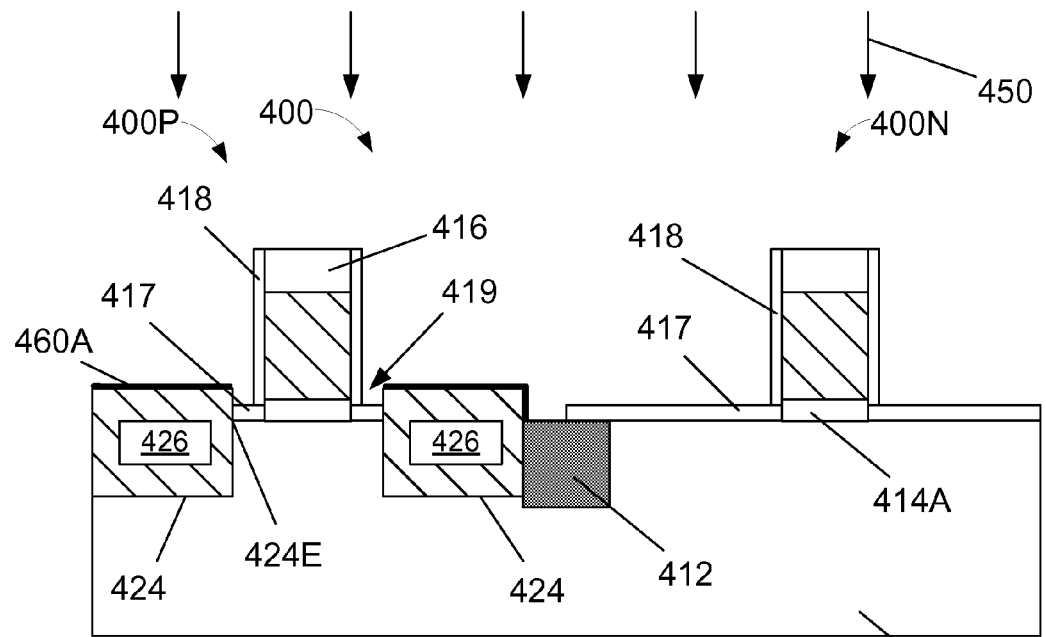

FIG. 5C depicts the product 400 after the above-described etching process 450 was performed to selectively and completely remove (relative to the surrounding materials) the initial sidewall spacer 420P from the PMOS transistor 400P and to completely remove the remaining portions of the layer of spacer 2 material 420L from the NMOS transistor 400N. This process operation exposes the low-k spacer 418 in both the PMOS transistor 400P and the NMOS transistor 400N. In one illustrative embodiment, where the initial spacer 420P (and layer 420L) is made of silicon nitride, the etching process may be performed using $H_3PO_4$ as the etchant. Formation of the hydrophilic surface material 460A, e.g., silicon dioxide, helps during the etching process that is performed to completely remove the spacer 2 materials from both devices as the etching process that is performed to remove the initial spacer 420P is performed in the presence of a hydrophilic material 460A. Moreover, by forming the hydrophilic layer 460A, the removal of the initial spacer 420P and the layer of spacer 2 material 420L in the NMOS region may be removed at substantially equal rates. In effect, in comparison to the embodiment shown in FIG. 4E, the performance of the surface oxidation process 460 is an extra step that is performed to effectively modify the hydrophobic surface of the PMOS epi semiconductor regions 426 into a hydrophilic surface.

Figure 5D:
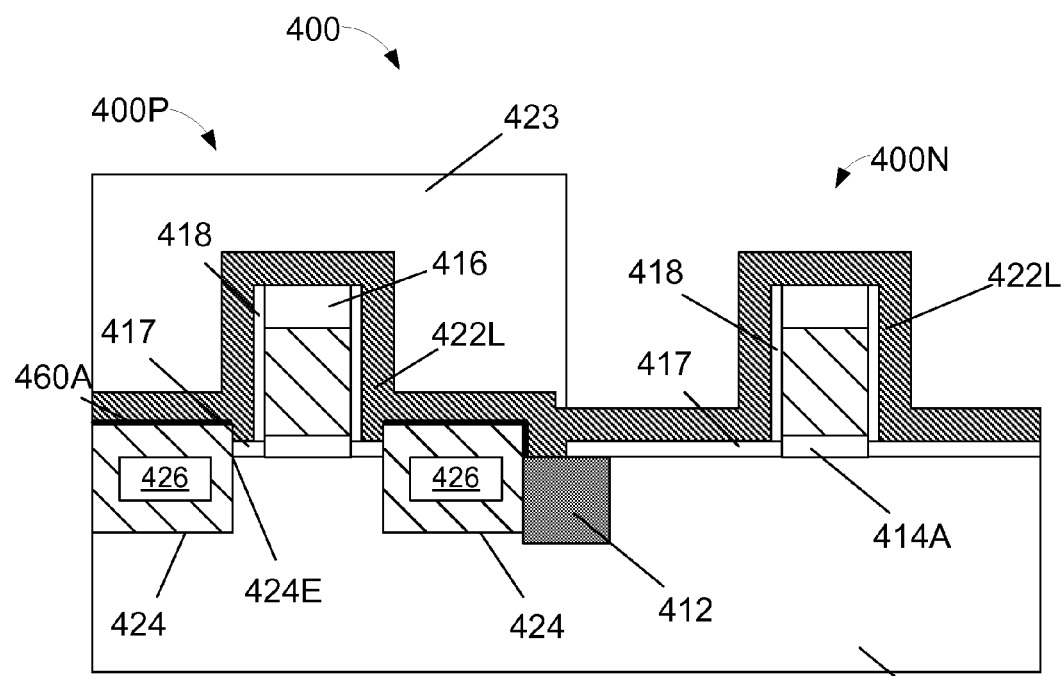

FIG. 5D depicts the product 400 after several process operations were performed. First, the above-described layer of spacer 3 material 422L was deposited above both the PMOS transistor 400P and the NMOS transistor 400N. Thereafter, the etch mask layer 423, such as photoresist, was formed so as to cover the PMOS transistor 400P while exposing the NMOS transistor 400N.

Figure 5E:
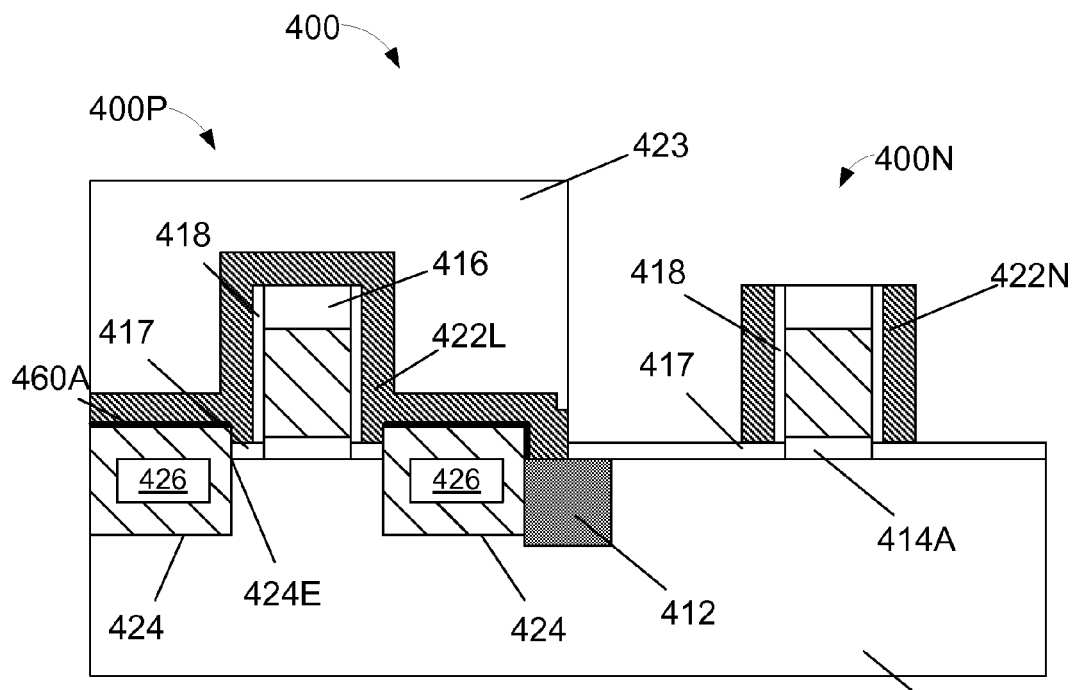

FIG. 5E depicts the product 400 after an anisotropic etching process was performed through the etch mask layer 423 to form the above-described initial NMOS sidewall spacer 422N ("spacer 3") adjacent the spacer 418 of the NMOS transistor 400N.

Figure 5F:
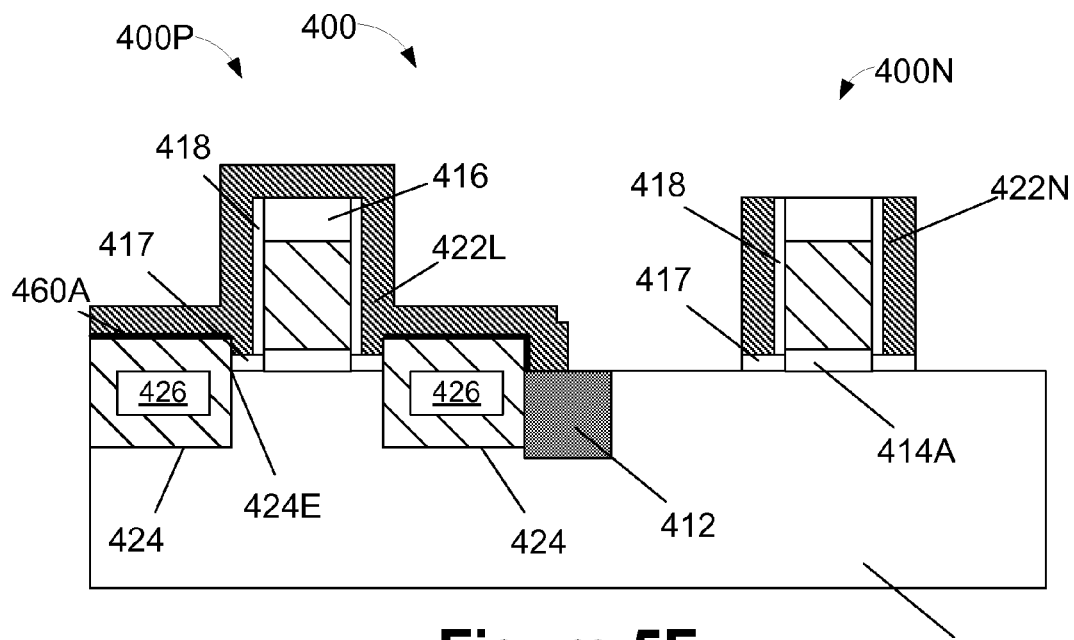

FIG. 5F depicts the product 400 after several process operations were performed. First, an anisotropic etching process was performed through the etch mask layer 423 to remove exposed portions of the layer 417 on the NMOS transistor 400N. Then, an ashing process was performed to remove the etch mask 423.

Figure 5G:
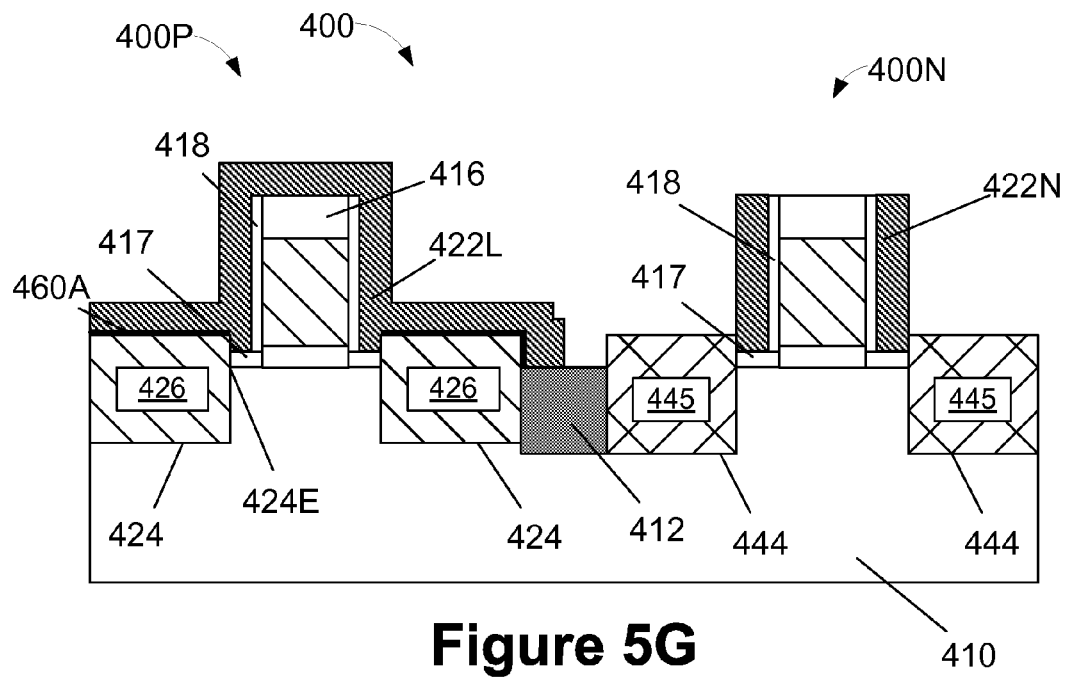

FIG. 5G depicts the product 400 after several process operations were performed on the product 400. First, one or more etching processes were performed to define the above-described NMOS source/drain cavities 444 in areas of the substrate 410. Then, the above-described epitaxial NMOS semiconductor material regions 445 (e.g., silicon carbon regions) were formed in the cavities 444.

Figure 5H:
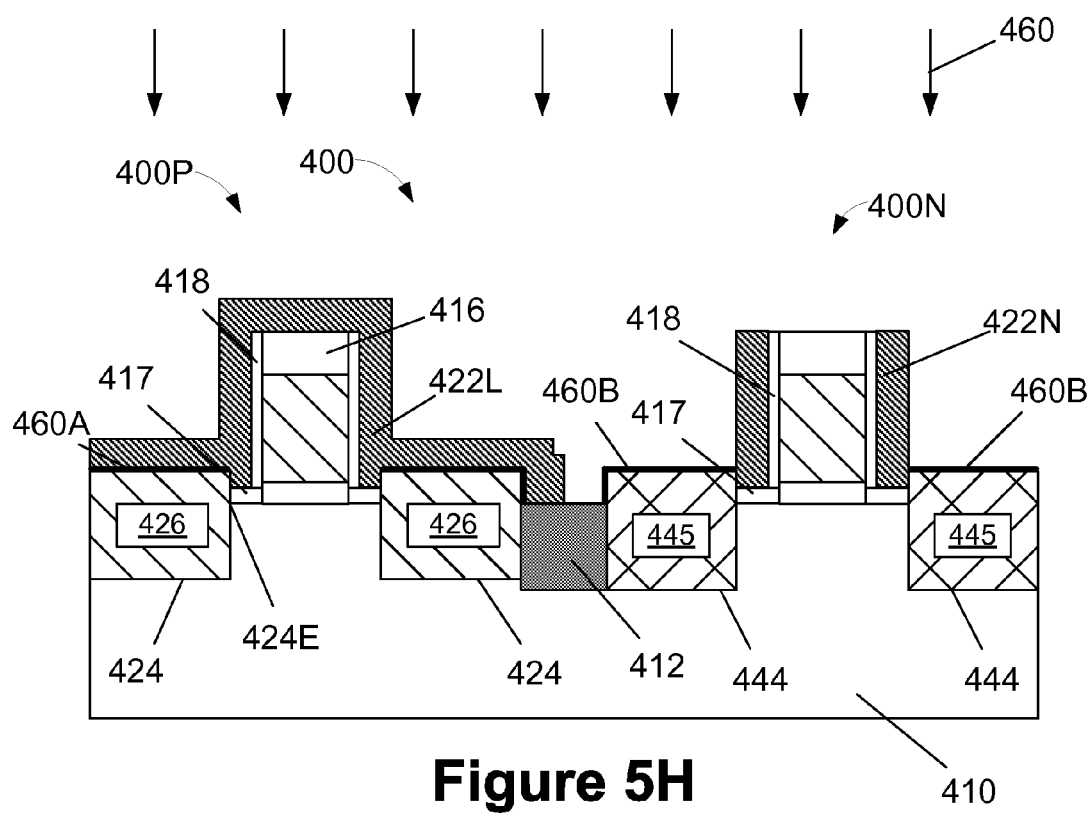

Next, as depicted in FIG. 5H, the above-described surface oxidation process 460 was performed to form a hydrophilic surface material 460B on the exposed surfaces of the epi NMOS source/drain regions 445. The hydrophilic surface material 460B is hydrophilic in the sense that it is more hydrophilic than the epi semiconductor materials 445. In the depicted example, the surface oxidation process 460 is performed with the initial sidewall spacer 422N in position on the NMOS transistor 400N and with the remaining portions of the layer of spacer 3 material 422L positioned above the PMOS transistor 400P. In the illustrative example depicted herein, the surface oxidation process 460 may be performed so as to form a substantially uniform layer of the hydrophilic surface material 460B, e.g., silicon dioxide, on the exposed surfaces of the epi semiconductor material 445.

Figure 5I:
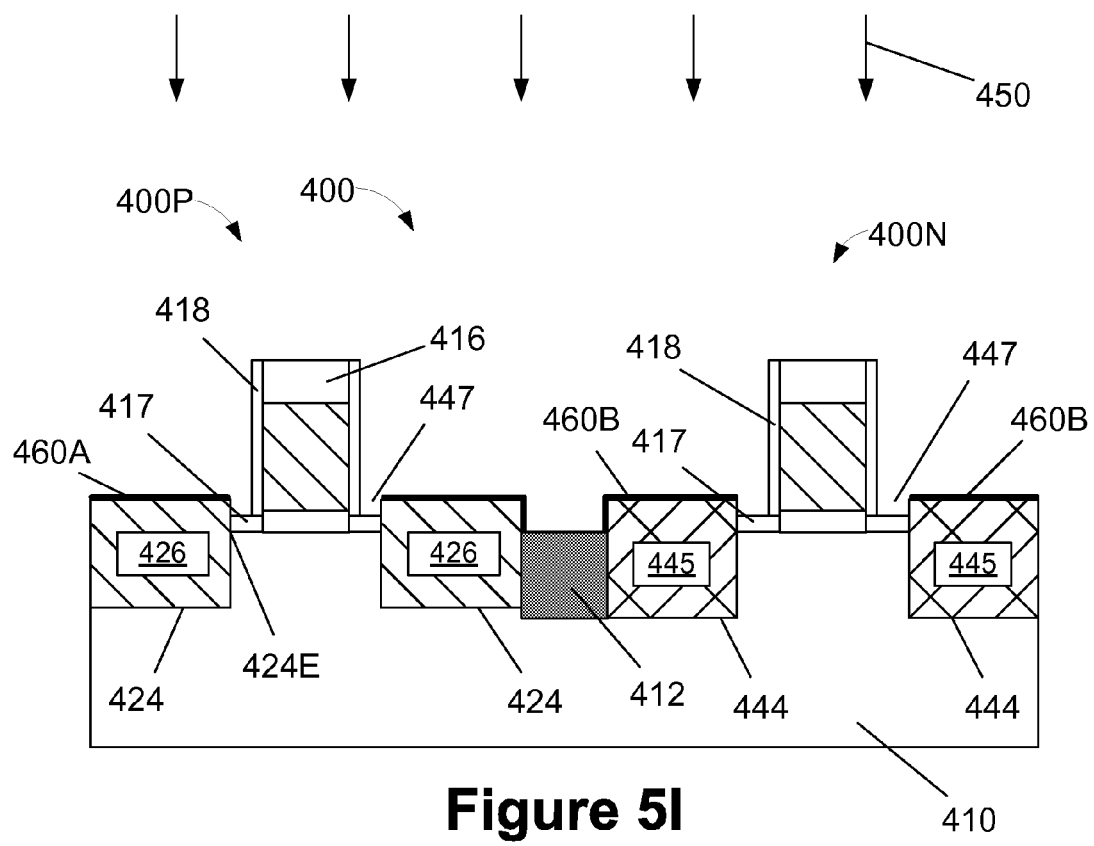

FIG. 5I depicts the product 400 after the above-described etching process 450 was performed to selectively remove (relative to the surrounding materials) the initial sidewall spacer 422N from the NMOS transistor 400N and to remove the remaining portions of the layer of spacer 3 material 422L from the PMOS transistor 400P. This process operation results in the exposure of the low-k spacers 418 in both the PMOS transistor 400P and the NMOS transistor 400N. In one illustrative embodiment, where the initial spacer 422N is made of silicon nitride, the etching process 450 may be performed using $H_3PO_4$ as the etchant.

As depicted in FIG. 5I, the low-k spacer 418 remains positioned in both the PMOS transistor 400P and the NMOS transistor 400N. Also note that, by removing the second and third spacers 420P, 422N, there is a gap 447, i.e., a lateral space, between a portion of the low-k spacers 418 and the epi semiconductor source/drain regions 426, 445. By removing the initial spacers 420P and 422N after they have served their purposes (e.g., locating the position of the source/drain cavities, etc.), a fresh and high quality insulating material with a k value less than silicon nitride (about 7.8), e.g., silicon dioxide (with a k value of about 3.9), can effectively be formed in their place. As a result, in comparison to the situation where the initial spacers 420P and 420N are left in place, a lower-k value material will be positioned between the gate and the source/drain contact structure (not shown), thereby reducing the gate to contact capacitance. Additionally, removal of the initial spacers 420P, 422N and the formation of fresh replacement low-k material between the gates and a contact structure on the epi PMOS source/drain regions 426, 445 of the devices results in a more defect free structure between the gates and the source/drain contacts (e.g., porous and substantially pinhole free) that is subjected to less contamination and implantation damage. At the point of fabrication shown in FIG. 5I, various process operations may be performed to complete the manufacture of the product 400, e.g., silicide formation, contact formation, formation of metallization layers, etc.

It should be noted that, when it is stated in this detailed description or in the claims that certain spacers or combinations of spacers are positioned "proximate" to a structure or component, such as a gate structure or another spacer structure, such language will be understood to cover situations where such a spacer or combinations of spacers actually contacts the structure or component, as well as a situation where there are one or more intervening layers of material between the spacer and the structure or component. For example, in some cases, there may be a liner layer or other spacers positioned between the referenced spacer and referenced structure, such as the illustrative gate structures 414 depicted herein. Additionally, the fact that the claims may make shorthand reference to a "first" spacer or a "first" type of process, such language does not mean that such a spacer or process was literally the first such spacer or process that was made or performed on the product 400.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a CMOS integrated circuit product comprised of a first transistor of a first type and a second transistor of a second type formed on a substrate, wherein said second type is opposite to said first type, the method comprising:
    forming a first gate structure for said first transistor and a second gate structure for said second transistor;
    forming a first spacer proximate both said first and second gate structures;
    forming an initial second spacer proximate said first spacer of said first transistor and a layer of second spacer material above said second transistor, said initial second spacer having an initial thickness;
    performing a first timed, wet etching process on both said first transistor and said second transistor so as to completely remove said layer of second spacer material from said second transistor and thereby expose said first spacer of said second transistor while leaving a first reduced thickness second spacer positioned adjacent said first spacer of said first transistor, wherein said first reduced thickness second spacer has a thickness that is less than said initial thickness of said initial second spacer; and
    forming a third spacer for said second transistor on and in contact with said first spacer of said second transistor.

2. The method of claim 1, wherein forming said initial second spacer proximate said first spacer of said first transistor comprises forming said initial second spacer on and in contact with said first spacer of said first transistor.

3. The method of claim 1, wherein forming said first spacer comprises forming said first spacer from a material having a k value less than 7.8.

4. The method of claim 3, wherein forming said initial second spacer comprises forming said initial second spacer from silicon nitride.

5. The method of claim 4, wherein forming said third spacer comprises forming said third spacer from silicon nitride.

6. The method of claim 1, wherein said first spacer is comprised of SiCON and said initial second spacer and said third spacer are comprised of silicon nitride.

7. The method of claim 1, wherein said initial second spacer is made of silicon nitride and wherein performing said first timed wet etching process on said initial second spacer of said first transistor comprises performing said first timed wet etching process using $H_3PO_4$ as an etchant.

8. The method of claim 1, wherein said thickness of said first reduced thickness second spacer is 30-50% of said initial thickness of said initial second spacer on said first transistor.

9. The method of claim 1, wherein, after forming said initial second spacer on said first transistor, and prior to performing said first timed wet etching process, the method further comprises:
    forming a plurality of first source/drain cavities in said substrate adjacent said first gate structure, wherein an uppermost inner edge of said first source/drain cavities are self-aligned with said initial second spacer in said first transistor; and
    forming a first epi semiconductor material in said first source/drain cavities.

10. The method of claim 9, wherein, after forming said third spacer, the method further comprises:
    forming a plurality of second source/drain cavities in said substrate adjacent said second gate structure, wherein an uppermost inner edge of said second source/drain cavities are self-aligned with said third spacer in said second transistor; and forming a second epi semiconductor material in said second source/drain cavities.

11. The method of claim 1, wherein forming said third spacer for said second transistor comprises forming a reduced thickness third spacer for said second transistor by performing a method that comprises:
   forming a layer of third spacer material above said first and second transistors;
   forming an etch mask layer that covers said layer of third spacer material positioned above said first transistor;
   with said etch mask in position, performing an etching process to define an initial third spacer for said second transistor that has an initial thickness;
   removing said etch mask layer; and
   performing a second timed, wet etching process on both said first transistor and said second transistor so as to completely remove said layer of third spacer material from said first transistor and thereby expose said first reduced thickness second spacer of said first transistor while leaving a second reduced thickness third spacer positioned adjacent said first spacer of said second transistor, wherein said reduced thickness third spacer has a thickness that is less than said initial thickness of said initial third spacer.

12. The method of claim 1, wherein said first transistor is a PMOS transistor and said second transistor is an NMOS transistor.

13. A method of forming a CMOS integrated circuit product comprised of a first transistor of a first type and a second transistor of a second type formed on a substrate, wherein said second type is opposite to said first type, comprising:
   forming a first gate structure for said first transistor and a second gate structure for said second transistor;
   forming a first spacer proximate both of said first and second gate structures, wherein said first spacer is made of a material having a k value that is less than 7.8;
   forming an initial second spacer on and in contact with said first spacer of said first transistor and a layer of second spacer material above said second transistor, wherein said initial second spacer has an initial thickness and is made of silicon nitride;
   performing a first timed wet etching process on said first transistor and said second transistor so as to completely remove said layer of second spacer material from said second transistor and thereby expose said first spacer of said second transistor while leaving a reduced thickness second spacer positioned adjacent said first spacer of said first transistor, wherein said reduced thickness second spacer has a thickness that is 30-50% of said initial thickness of said initial second spacer of said first transistor; and
   forming a third spacer made of silicon nitride on and in contact with said first spacer of said second transistor.

14. The method of claim 13, wherein performing said first timed wet etching process on said initial second spacer comprises performing said first timed wet etching process using $H_3PO_4$ as an etchant.

15. The method of claim 13, wherein, after forming said initial second spacer on said first transistor, and prior to performing said first timed wet etching process, the method further comprises:
   forming a plurality of first source/drain cavities in said substrate adjacent said first gate structure, wherein an uppermost inner edge of said first source/drain cavities are self-aligned with said initial second spacer in said first transistor; and
   forming a first epi semiconductor material in said first source/drain cavities.

16. The method of claim 15, wherein, after forming said third spacer, the method further comprises:
   performing an etching process to form a plurality of second source/drain cavities in said substrate adjacent said second gate structure, wherein an uppermost inner edge of said second source/drain cavities are self-aligned with said third spacer in said second transistor; and
   forming a second epi semiconductor material in said second source/drain cavities.

17. The method of claim 13, wherein forming said third spacer for said second transistor comprises forming a reduced thickness third spacer for said second transistor by performing a method that comprises:
   forming a layer of third spacer material above said first and second transistors;
   forming an etch mask layer that covers said layer of third spacer material positioned above said first transistor;
   with said etch mask in position, performing an etching process to define an initial third spacer for said second transistor that has an initial thickness;
   removing said etch mask layer; and
   performing a second timed, wet etching process on both said first transistor and said second transistor so as to completely remove said layer of third spacer material from said first transistor and thereby expose said first reduced thickness second spacer of said first transistor while leaving a second reduced thickness third spacer positioned adjacent said first spacer of said second transistor, wherein said reduced thickness third spacer has a thickness that is less than said initial thickness of said initial third spacer.

18. A method of forming a CMOS integrated circuit product comprised of a first transistor of a first type and a second transistor of a second type formed on a substrate, wherein said second type is opposite to said first type, the method comprising:
   forming a first gate structure for said first transistor and a second gate structure for said second transistor;
   forming a first spacer proximate both said first and second gate structures;
   forming an initial second spacer proximate said first spacer of said first transistor and a layer of second spacer material above said second transistor, said initial second spacer having an initial thickness;
   performing a first timed, wet etching process on both said first transistor and said second transistor so as to completely remove said layer of second spacer material from said second transistor and thereby expose said first spacer of said second transistor while leaving a first reduced thickness second spacer positioned adjacent said first spacer of said first transistor, wherein said first reduced thickness second spacer has a thickness that is less than said initial thickness of said initial second spacer;
   forming an initial third spacer proximate said first spacer of said second transistor and a layer of third spacer material above said first transistor, said initial third spacer having an initial thickness; and
   performing a second timed, wet etching process on both said first transistor and said second transistor so as to completely remove said layer of third spacer material from said first transistor and thereby expose said first reduced thickness second spacer of said first transistor while leaving a second reduced thickness third spacer positioned adjacent said first spacer of said second transistor, wherein said reduced thickness third spacer has a thickness that is less than said initial thickness of said initial third spacer.

19. The method of claim 18, wherein forming said initial second spacer proximate said first spacer of said first transistor comprises forming said initial second spacer on and in contact with said first spacer of said first transistor.

20. The method of claim 19, wherein forming said initial third spacer proximate said first spacer of said second transistor comprises forming said initial third spacer on and in contact with said first spacer of said second transistor.

21. The method of claim 18, wherein forming said first spacer comprises forming said first spacer from a material having a k value less than 7.8.

22. The method of claim 21, wherein forming said initial second spacer comprises forming said initial second spacer from silicon nitride.

23. The method of claim 22, wherein forming said initial third spacer comprises forming said initial third spacer from silicon nitride.

24. The method of claim 18, wherein said first spacer is comprised of SiCON and said initial second spacer and said initial third spacer are comprised of silicon nitride.

25. The method of claim 18, wherein performing said first and second timed wet etching processes comprises performing said first and second timed wet etching process using $H_3PO_4$ as an etchant.

26. The method of claim 18, wherein said thickness of said first reduced thickness second spacer is 30-50% of said initial thickness of said initial second spacer on said first transistor.

27. The method of claim 26, wherein said thickness of said first reduced thickness third spacer is 30-50% of said initial thickness of said initial third spacer on said second transistor.

28. The method of claim 18, wherein, after forming said initial second spacer on said first transistor, and prior to performing said first timed wet etching process, the method further comprises:

forming a plurality of first source/drain cavities in said substrate adjacent said first gate structure, wherein an uppermost inner edge of said first source/drain cavities are self-aligned with said initial second spacer in said first transistor; and forming a first epi semiconductor material in said first source/drain cavities.

29. The method of claim 28, wherein, after forming said initial third spacer, and prior to performing said second timed wet etching process, the method further comprises:

forming a plurality of second source/drain cavities in said substrate adjacent said second gate structure, wherein an uppermost inner edge of said second source/drain cavities are self-aligned with said initial third spacer in said second transistor; and forming a second epi semiconductor material in said second source/drain cavities.

* * * * *